(12) United States Patent
Shih

(10) Patent No.: US 8,536,666 B2
(45) Date of Patent: Sep. 17, 2013

(54) SILICON MICROPHONE WITH INTEGRATED BACK SIDE CAVITY

(71) Applicant: Texas Instruments Incorporated, Dallas, TX (US)

(72) Inventor: Wei-Yan Shih, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/670,134

(22) Filed: Nov. 6, 2012

(65) Prior Publication Data

US 2013/0064400 A1 Mar. 14, 2013

Related U.S. Application Data

(62) Division of application No. 12/969,859, filed on Dec. 16, 2010, now Pat. No. 8,304,846.

(60) Provisional application No. 61/291,763, filed on Dec. 31, 2009.

(51) Int. Cl.
*H01L 29/84* (2006.01)

(52) U.S. Cl.
USPC .............................................. 257/416

(58) Field of Classification Search
USPC ..................................... 257/416; 381/174
See application file for complete search history.

(56) References Cited

U.S. PATENT DOCUMENTS

| | | | |
|---|---|---|---|
| 5,452,268 A | 9/1995 | Bernstein | |
| 5,677,965 A | 10/1997 | Moret et al. | |
| 2002/0067663 A1 | 6/2002 | Loeppert et al. | |
| 2007/0065968 A1 | 3/2007 | Kok et al. | |
| 2008/0137886 A1* | 6/2008 | Schrank | 381/174 |
| 2009/0169035 A1 | 7/2009 | Rombach et al. | |
| 2011/0158439 A1 | 6/2011 | Denison et al. | |

FOREIGN PATENT DOCUMENTS

JP 2001-145196 5/2001

* cited by examiner

*Primary Examiner* — Bradley K Smith
(74) *Attorney, Agent, or Firm* — Warren L. Franz; Wade J. Brady, III; Frederick J. Telecky, Jr.

(57) ABSTRACT

An integrated circuit containing a capacitive microphone with a back side cavity located within the substrate of the integrated circuit. Access holes may be formed through a dielectric support layer at the surface of the substrate to provide access for etchants to the substrate to form the back side cavity. The back side cavity may be etched after a fixed plate and permeable membrane of the capacitive microphone are formed by providing etchants through the permeable membrane and through the access holes to the substrate.

7 Claims, 33 Drawing Sheets

SILICON MICROPHONE WITH INTEGRATED BACK SIDE CAVITY

CROSS-REFERENCE TO RELATED APPLICATIONS

This application is a division of application Ser. No. 12/969,859, filed Dec. 16, 2010 (now U.S. Pat. No. 8,304, 846), which claims the benefit of Provision Application No. 61/291,763, filed Dec. 31, 2009, the entireties of both of which are hereby incorporated by reference.

Application Ser. No. 12/969,784, filed Dec. 16, 2010, which deals with related subject matter is also incorporated herein by reference.

FIELD OF THE INVENTION

This invention relates to the field of integrated circuits. More particularly, this invention relates to microphones in integrated circuits.

BACKGROUND

Integration of a microphone in an integrated circuit may require formation of a back cavity to attain desired levels of microphone sensitivity. Formation of a back cavity with a sufficient volume may increase fabrication cost and complexity of the integrated circuit.

SUMMARY

An integrated circuit containing a capacitive microphone with a back side cavity may be formed so that the back side cavity is located within the substrate of the integrated circuit. Access holes may be formed through a dielectric support layer on the surface of the substrate to provide access for etchants to the substrate to form the back side cavity. The back side cavity may be etched after a fixed plate and permeable membrane of the capacitive microphone are formed by providing etchants through the permeable membrane and through the access holes to the substrate.

DETAILED DESCRIPTION OF EXAMPLE EMBODIMENTS

A capacitive microphone may be formed in an integrated circuit by etching a back cavity in a substrate of the integrated circuit such that the cavity does not extend to a bottom surface of the substrate. Etching of the cavity may further be performed at a top surface of the integrated circuit. A dielectric support layer may be formed on a top surface of the substrate, and access holes may be formed in the dielectric support layer to provide access to the substrate for cavity etchants from the top surface of the integrated circuit.

Figure 1A:
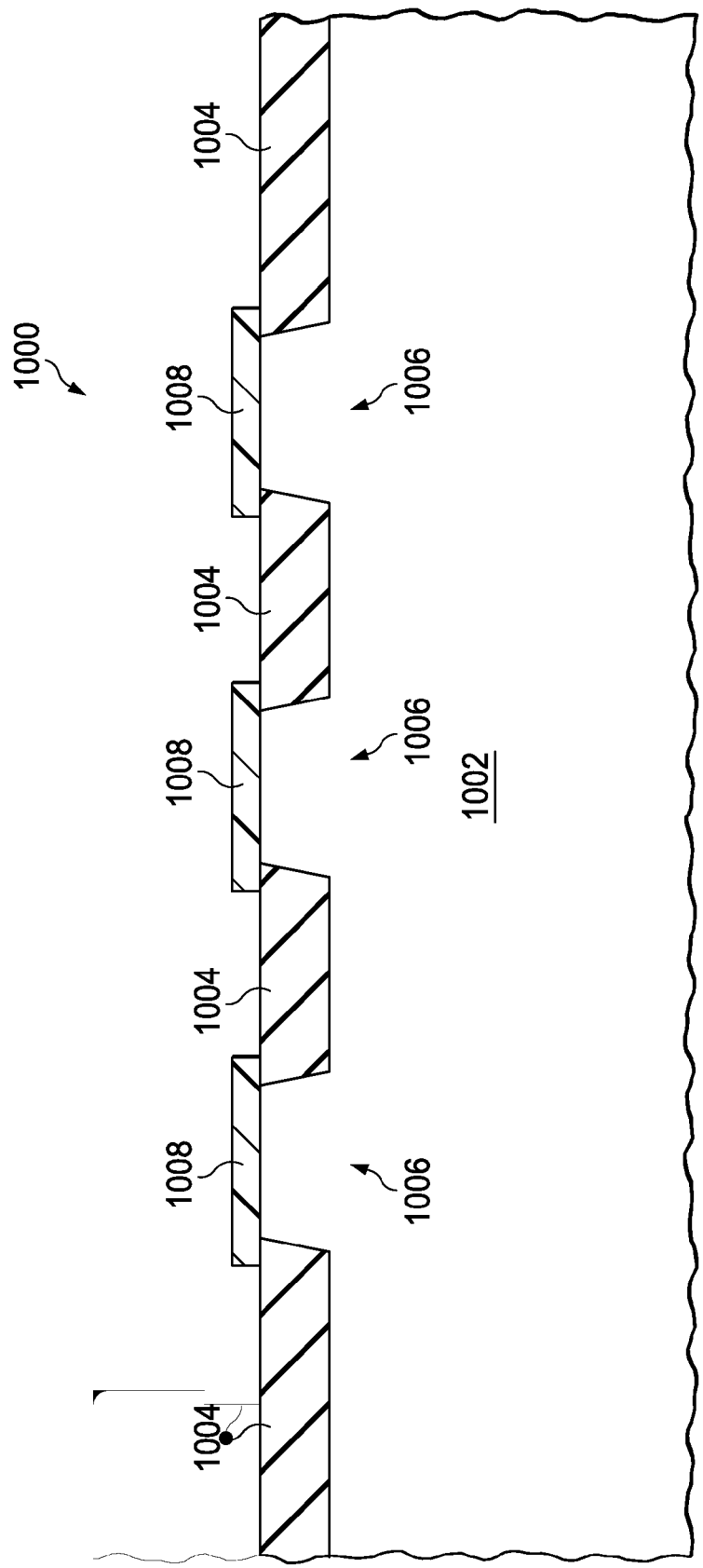
FIGS. 1A through 1I are cross-sectional views of an integrated circuit containing a capacitive microphone formed according to a first embodiment, depicted in successive stages of fabrication.

FIGS. 1A through 1I are cross-sectional views of an integrated circuit containing a capacitive microphone formed according to a first embodiment, depicted in successive stages of fabrication. Referring to FIG. 1A, the integrated circuit 1000 is formed in and on a substrate 1002 which is commonly a single crystal silicon wafer, but may be a silicon-on-insulator (SOI) wafer, a hybrid orientation technology (HOT) wafer with regions of different crystal orientations, or other structure with a semiconductor region at a top surface of the substrate 1002 appropriate for fabrication of the IC 1000. A dielectric support layer 1004 is formed at the top surface of the substrate 1002. In the instant embodiment, the dielectric support layer 1004 is substantially formed of field oxide 1004 using shallow trench isolation (STI) processes in which trenches, commonly 200 to 500 nanometers deep, are etched into the integrated circuit 1000, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). It is within the scope of alternate embodiments to form dielectric support layers of field oxide using local oxidation of silicon (LOCOS) processes. Access holes 1006 are formed in the field oxide 1004 to provide access to the substrate 1002 in a subsequent cavity etching step. The field oxide 1004 is contiguous in a region defined for the capacitive microphone. One or more optional silicide block layers 1008 may be formed on a top surface of the substrate 1002 over the access holes 1006 to prevent formation of metal silicide on the substrate 1002 during subsequent fabrication steps. The silicide block layers 1008 may be silicon nitride between 10 and 100 nanometers thick in one example, or silicon dioxide between 250 and 200 nanometers thick in another example. The silicide block layers 1008, if formed, may be removed during subsequent fabrication steps.

Figure 1B:
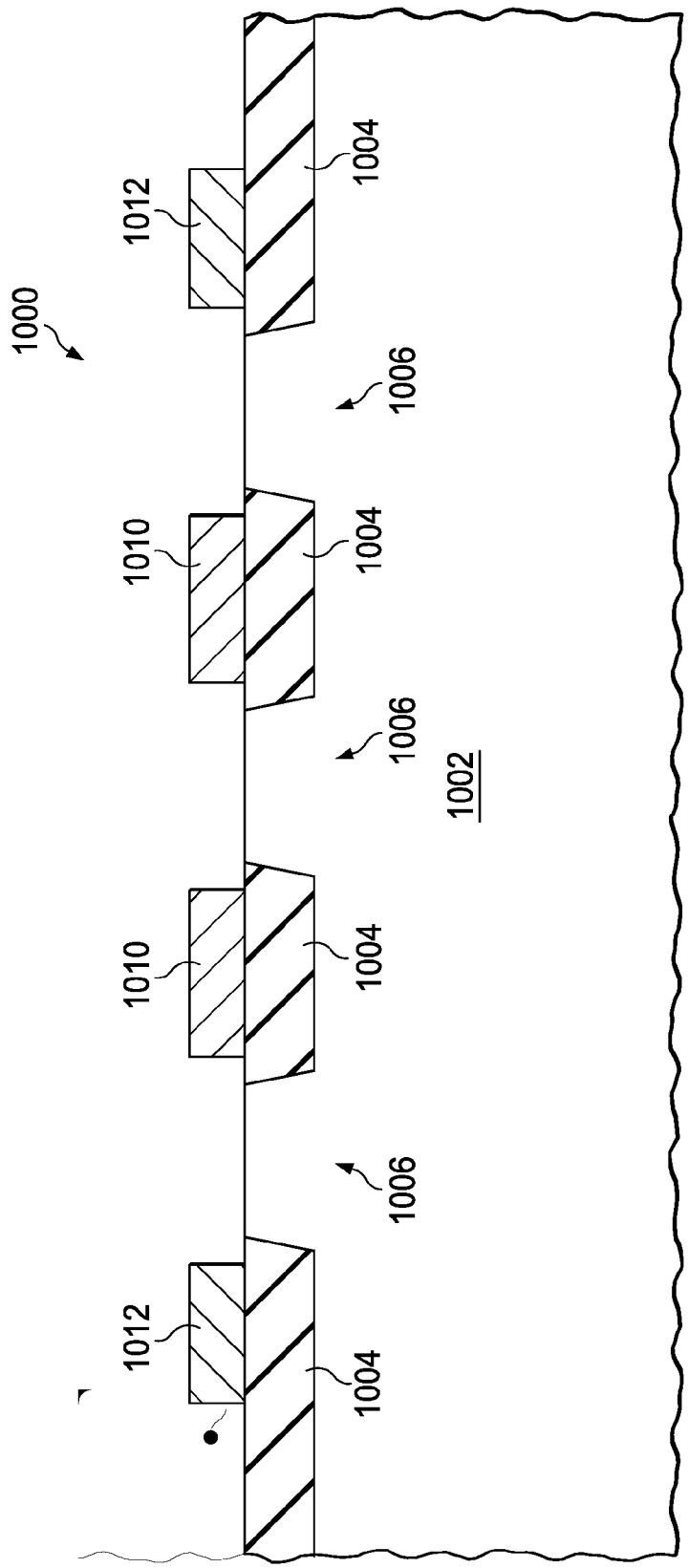

Referring to FIG. 1B, a fixed plate 1010 is formed above the field oxide 1004 adjacent to the access holes 1006. The fixed plate 1010 provides one capacitor plate of the capacitive microphone. Optional membrane terminals 1012 may be formed concurrently with the fixed plate 1010, as depicted in FIG. 1B, or may be formed in other fabrication steps. In one realization of the instant embodiment, the fixed plate 1010 and optional membrane terminals 1012, if formed, may be fully silicided polycrystalline silicon. In other realizations of the instant embodiment, the fixed plate 1010 and optional membrane terminals 1012, if formed, may be a metal such as tungsten or aluminum. In one realization, the fixed plate 1010 may be less than 100 microns wide. A protective layer (not shown), possibly an electrically insulating layer, may optionally be formed over the fixed plate 1010 to isolate the fixed plate 1010 during an operational lifetime of the capacitive microphone.

Figure 1C:
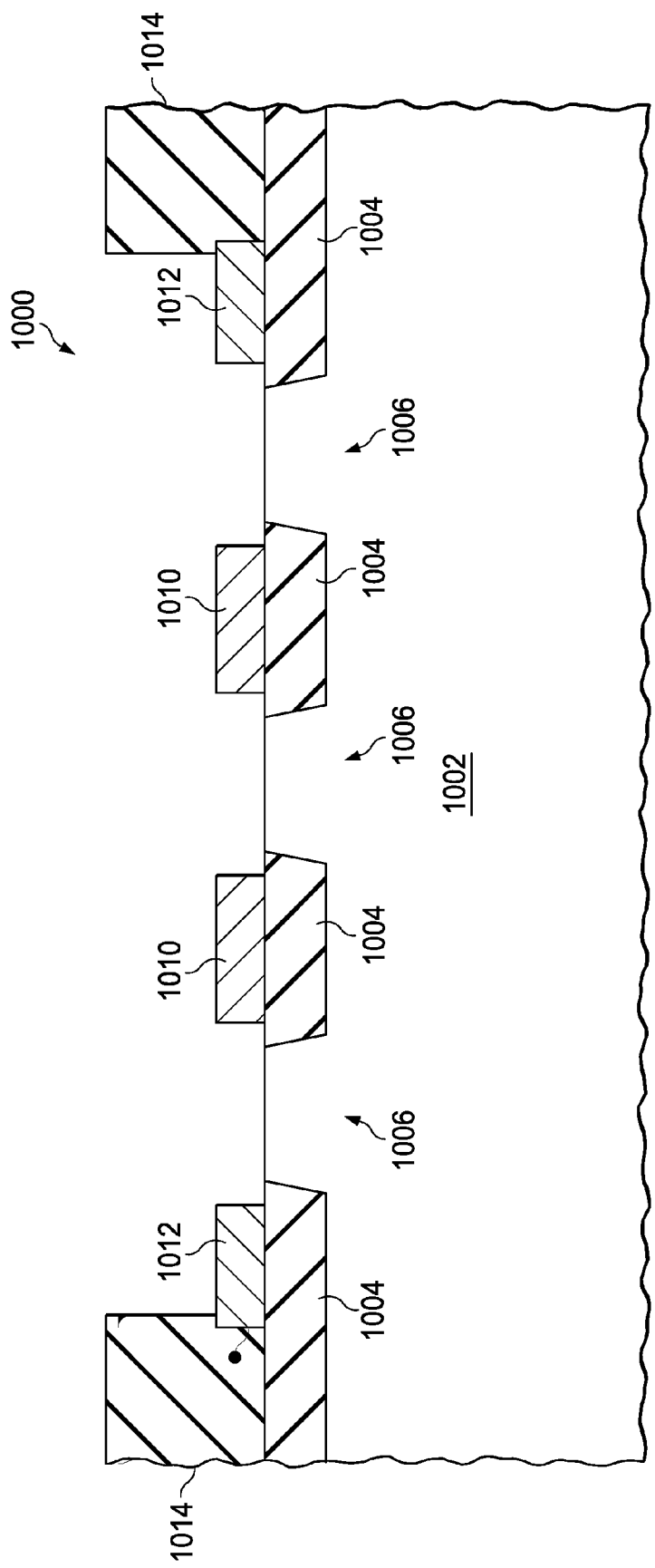

Referring to FIG. 1C, optional interconnect and dielectric levels 1014 may be formed above the substrate 1002. The dielectric levels may be silicon dioxide or a low-k dielectric material, such as organo-silicate glass (OSG), carbon-doped silicon oxides (SiCO or CDO) or methylsilsesquioxane (MSQ). The interconnect levels may include aluminum or copper.

Figure 1D:
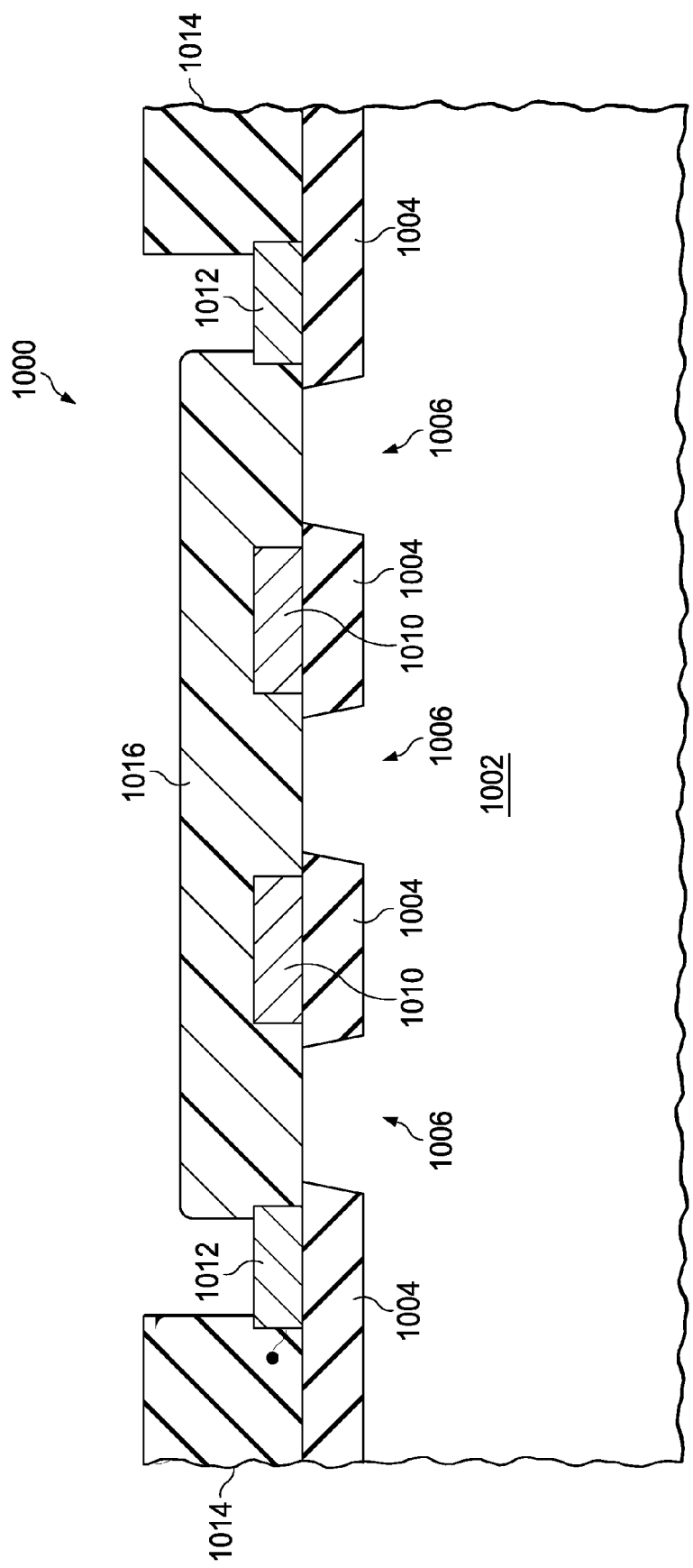

Referring to FIG. 1D, a capacitor cavity sacrificial layer 1016 is formed above the fixed plate 1010. The capacitor cavity sacrificial layer 1016 includes sacrificial material such as photoresist or polyimide. In one realization of the instant embodiment, the capacitor cavity sacrificial layer 1016 may be formed by photolithographic processes, for example by forming a layer of photo-sensitive sacrificial material on an existing top surface of the integrated circuit 1000, exposing a pattern of the photo-sensitive sacrificial material using photolithographic equipment, for example a wafer stepper or a wafer scanner, and developing the photo-sensitive sacrificial material to leave the capacitor cavity sacrificial layer 1016. In another realization, a layer of sacrificial material may be formed on the existing top surface of the integrated circuit 1000, a photoresist pattern may be formed above the layer of sacrificial material to define an area for the capacitor cavity sacrificial layer 1016, and unwanted sacrificial material removed, to leave the capacitor cavity sacrificial layer 1016. Other processes to form the capacitor cavity sacrificial layer 1016 are within the scope of the instant embodiment.

Figure 1E:
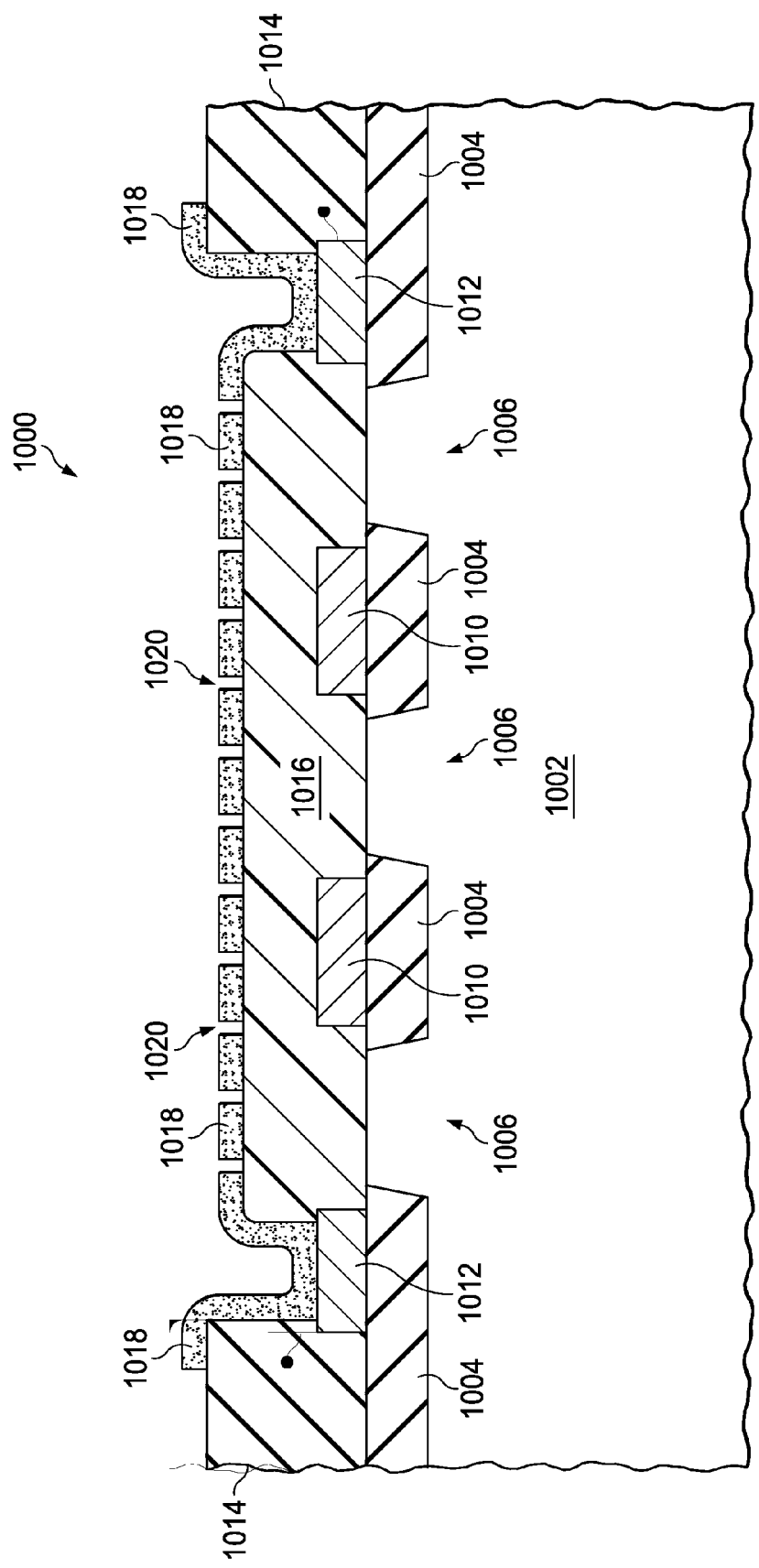

Referring to FIG. 1E, a contiguous permeable membrane 1018 is formed on the capacitor cavity sacrificial layer 1016. The permeable membrane 1018 provides a second capacitor plate of the capacitive microphone. In one realization of the instant embodiment, the permeable membrane 1018 may be formed of a metal used in interconnect levels in the integrated circuit 1000. Membrane holes 1020 are formed in the permeable membrane 1018. In one realization of the instant embodiment, a vertical separation between a bottom surface of the permeable membrane 1018 and a top surface of the fixed plate 1010 is less than 200 nanometers. In an alternate realization of the instant embodiment, vertical separation between the bottom surface of the permeable membrane 1018 and the top surface of the fixed plate 1010 is less than 100 nanometers.

Figure 1F:
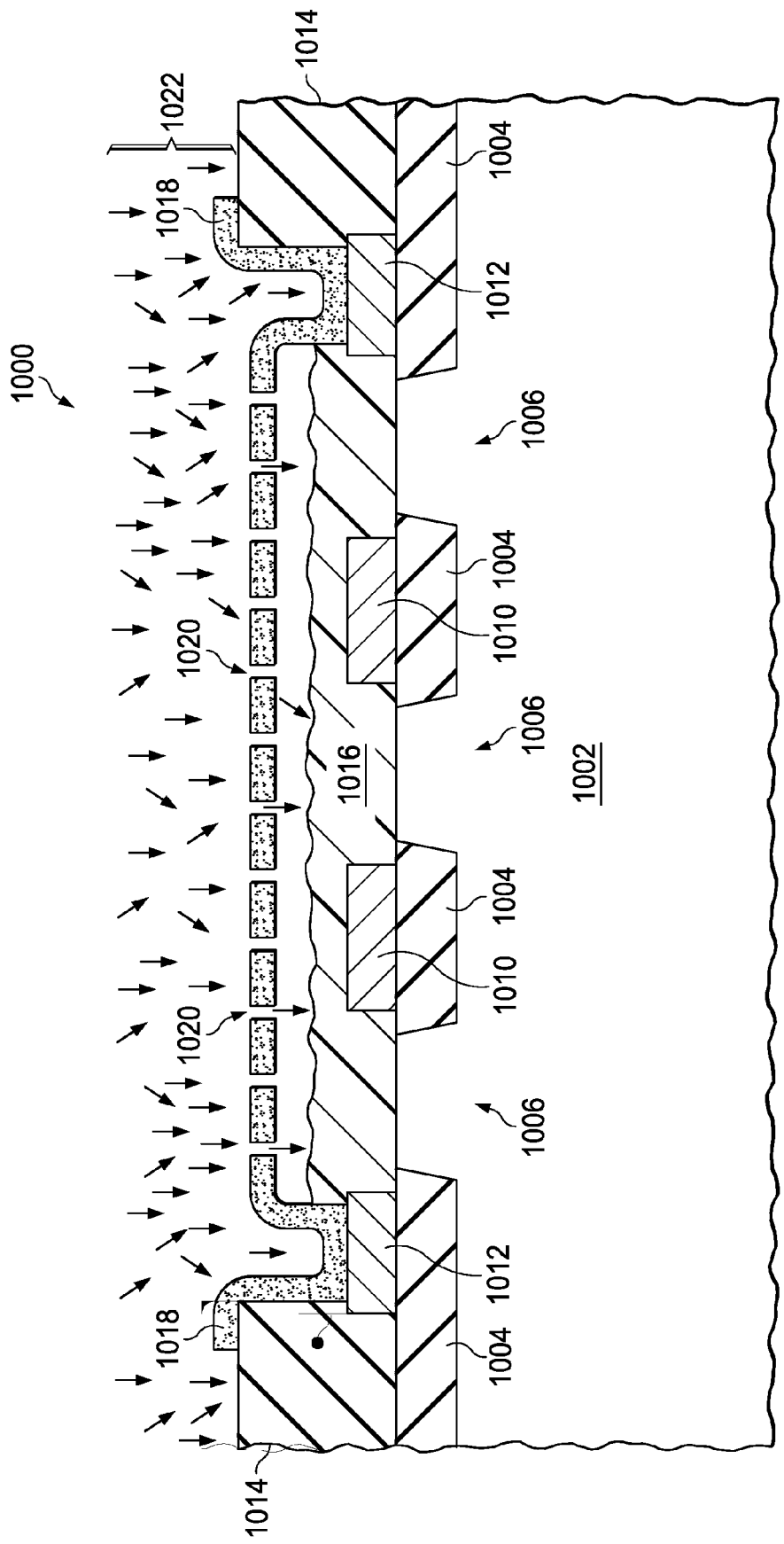

Referring to FIG. 1F, a sacrificial layer removal process 1022 is performed to remove sacrificial material from the capacitor cavity sacrificial layer 1016. In one realization of the instant embodiment, the sacrificial layer removal process 1022 provides reactive molecules, atoms or radicals which diffuse through the membrane holes 1020 and remove sacrificial material from the capacitor cavity sacrificial layer 1016, as depicted in FIG. 1F. In a realization of the instant embodiment, the sacrificial layer removal process 1022 generates reactive oxygen species and possibly reactive fluorine species in a remote plasma and provides a means for the reactive oxygen species to diffuse to the integrated circuit 1000 in an electric field-free region. In another realization of the instant embodiment, the sacrificial layer removal process 1022 provides ozone to the integrated circuit 1000. In an alternate realization of the instant embodiment, the sacrificial layer removal process 1022 provides an increased temperature to the integrated circuit, for example between 300 C and 500 C, and possibly a reactive ambient, for example oxygen, causing decomposition of the sacrificial material in the capacitor cavity sacrificial layer 1016.

Figure 1G:
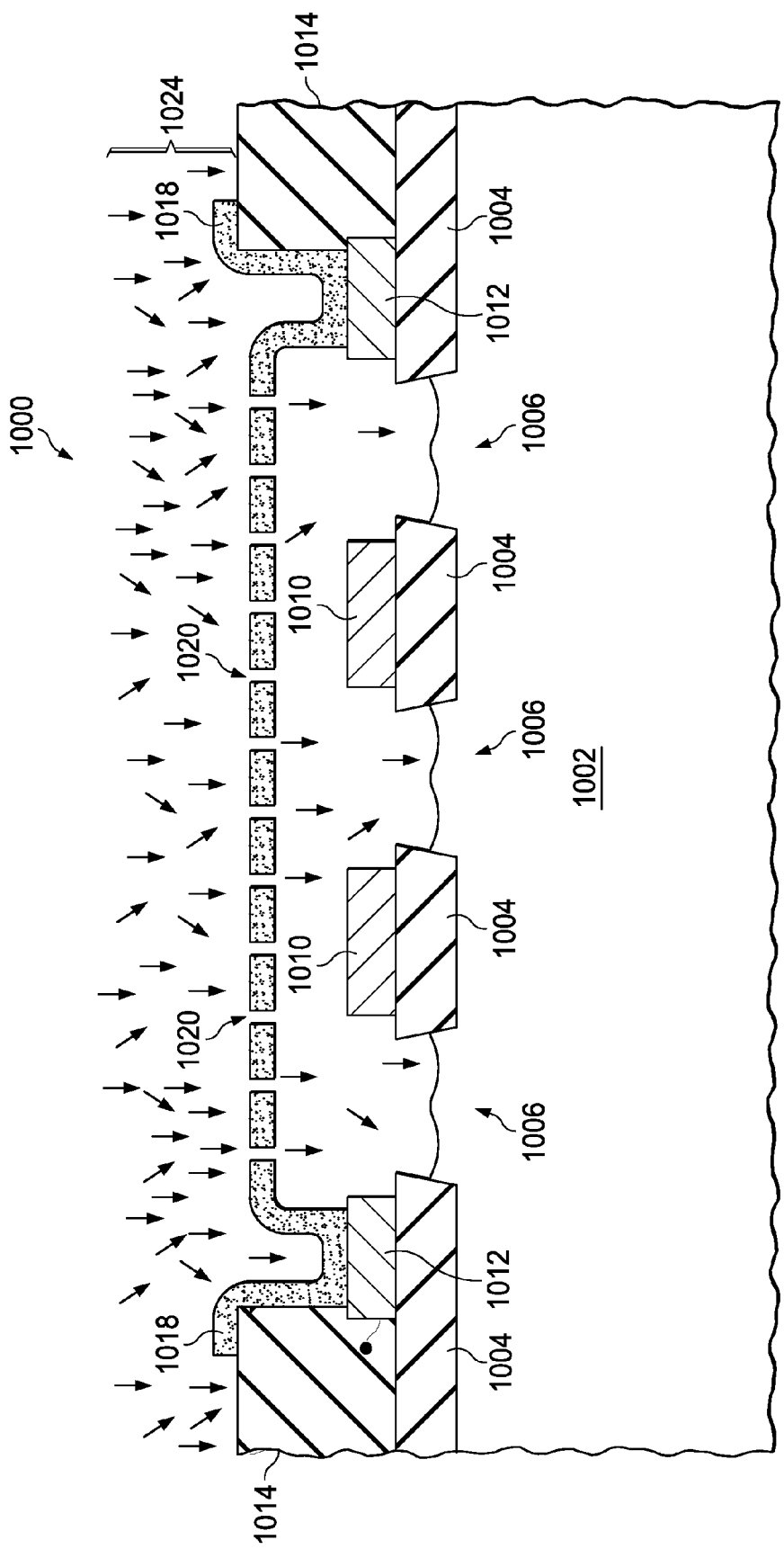

Referring to FIG. 1G, a cavity formation process 1024 is performed to provide reactive species through the membrane holes 1020 to the substrate 1002 in the access holes 1006. In one realization of the instant embodiment, the cavity formation process 1024 uses $SF_6$ gas in a plasma to provide fluorine containing reactive species to the substrate 1002. Semiconductor material is removed from exposed surfaces of the substrate 1002 by the reactive species provided by the cavity formation process 1024. An etch rate of the field oxide 1004 is much less than an etch rate of the substrate 1002 by the cavity formation process 1024, for example less than 5 percent.

Figure 1H:
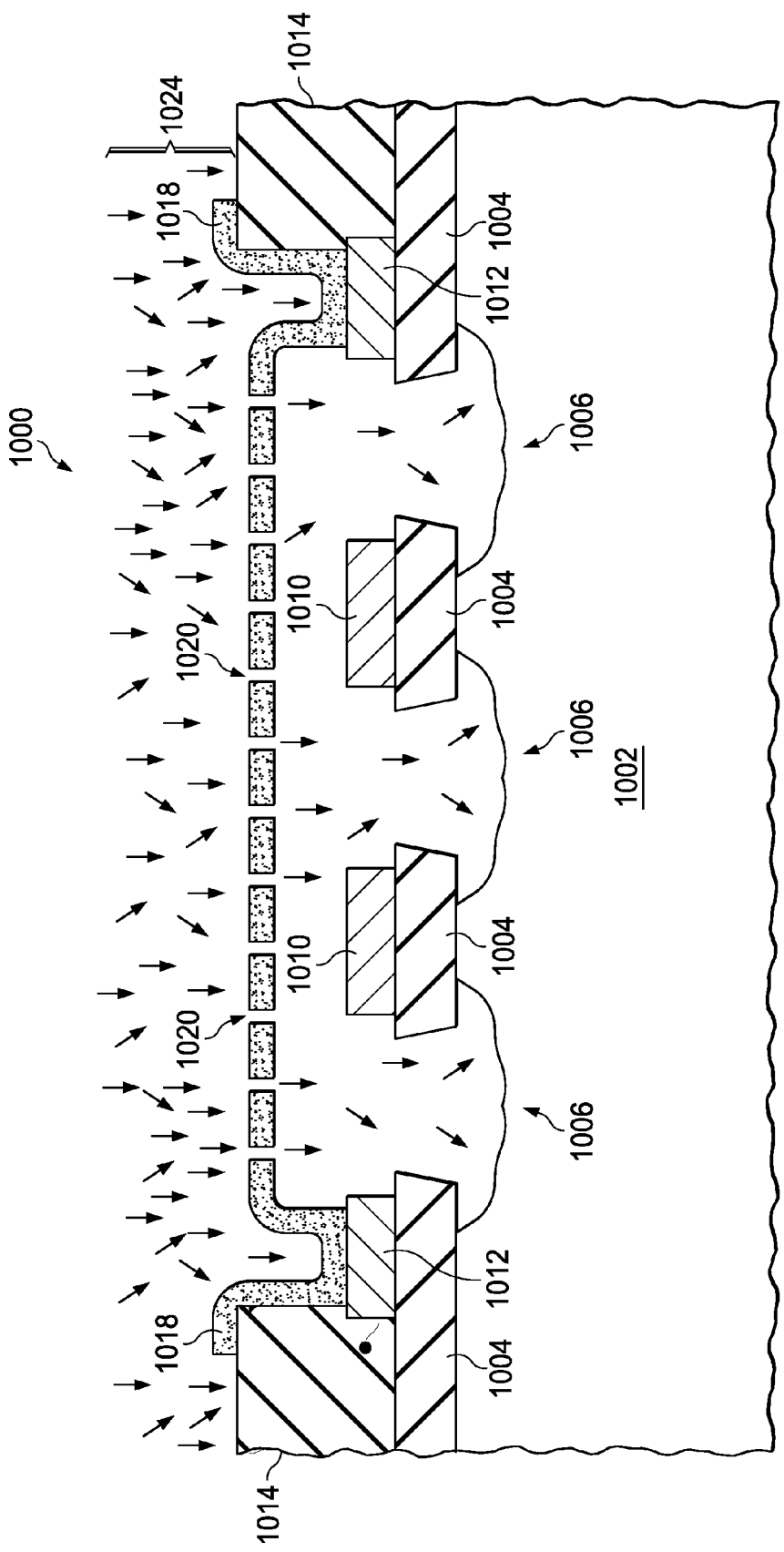

FIG. 1H depicts the integrated circuit 1000 during a later stage of the cavity formation process 1024. Reactive species from the cavity formation process 1024 diffuse through the access holes 1006 and remove semiconductor material from the substrate 1002 under the field oxide 1004 adjacent to the access holes 1006.

Figure 1I:
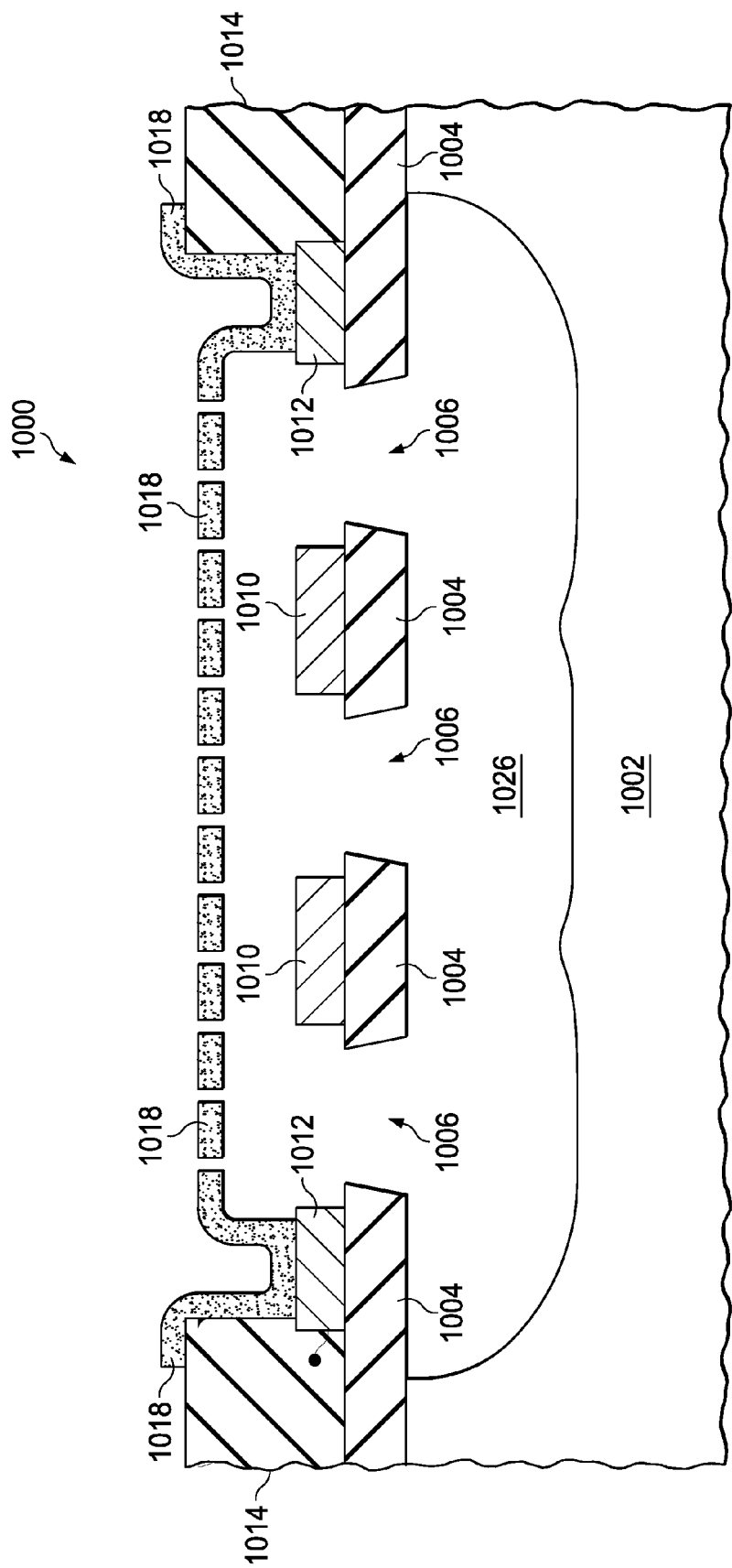

FIG. 1I depicts the integrated circuit 1000 after formation of the capacitive microphone is substantially complete. A back side cavity 1026 has been formed in the substrate 1002 under the fixed plate 1010 of the capacitive microphone, such that a bottom of the back side cavity 1026 is within the substrate 1002. A protective coating (not shown) may optionally be formed on exposed surfaces of the membrane 1018 and the back side cavity 1026 for protection during an operational lifetime of the capacitive microphone. The back-side cavity connects to a space between the fixed plate 1010 and the membrane 1018 through the access holes 1006. In one realization of the instant embodiment, the back side cavity 1026 may extend laterally beyond the membrane 1018. In one realization of the instant embodiment, a volume of the back side cavity 1026 is more than 100 times as large as a volume of the space between the fixed plate 1010 and the membrane 1018. In a further embodiment, the volume of the back side cavity 1026 is more than 1000 times as large as the volume of the space between the fixed plate 1010 and the membrane 1018.

Figure 2A:
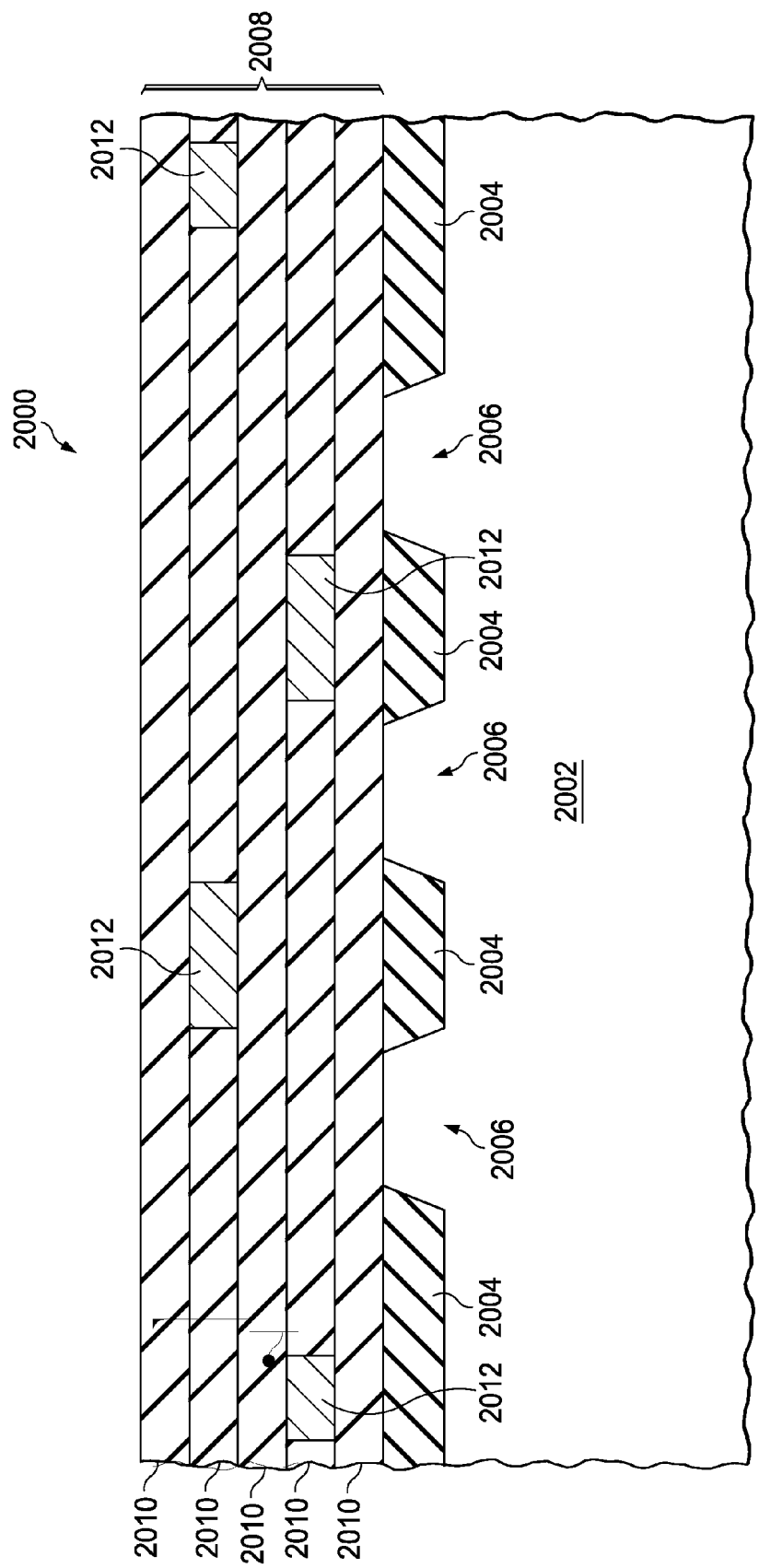
FIGS. 2A through 2H are cross-sectional views of an integrated circuit containing a capacitive microphone formed according to a second embodiment, depicted in successive stages of fabrication.

FIGS. 2A through 2H are cross-sectional views of an integrated circuit containing a capacitive microphone formed according to a second embodiment, depicted in successive stages of fabrication. Referring to FIG. 2A, the integrated circuit 2000 is formed in and on a substrate 2002 as described in reference to FIG. 1A. In the instant embodiment, a contiguous dielectric support layer of STI field oxide 2004 is formed at a top surface of the substrate 2002 with access holes 2006 in the field oxide 2004 as described in reference to FIG. 1A. In one realization of the instant embodiment, metal silicide is prevented from forming on a top surface of the substrate 2002 in the access holes 2006, as described in reference to FIG. 1A. An interconnect region 2008 is formed above the substrate 2002 and field oxide 2004, which includes dielectric layers 2010 and metal interconnect components 2012. In some realizations of the instant embodiment, no metal interconnect components 2012 are located in an area defined for the capacitive microphone. In the instant embodiment, no metal interconnect components 2012 are located directly above the access holes 2006.

Figure 2B:
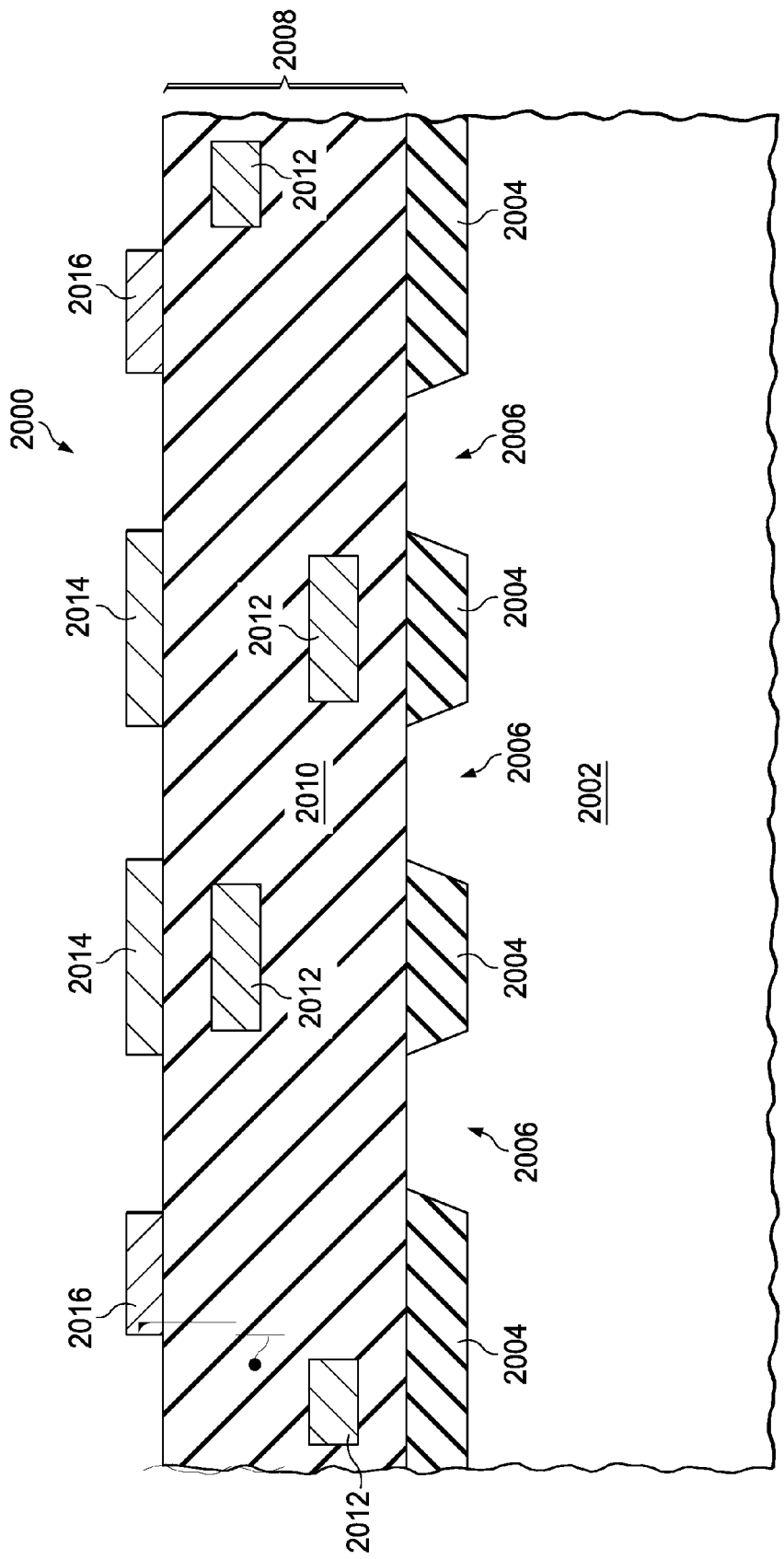

Referring to FIG. 2B, a fixed plate 2014 is formed above the interconnect region 2008. In one realization of the instant embodiment, the fixed plate 2014 is formed of similar materials as the metal interconnect components 2012 in the interconnect region 2008. In the instant embodiment, no portions of the fixed plate 2014 are located directly above the access holes 2006. Optional membrane terminals 2016 may be formed concurrently with the fixed plate 2014, as depicted in FIG. 2B, or may be formed in other fabrication steps. In one realization of the instant embodiment, the fixed plate 2014 and optional membrane terminals 2016, if present, include aluminum. In an alternate realization of the instant embodiment, the fixed plate 2014 and optional membrane terminals 2016, if present, include copper. A protective layer (not shown), possibly an electrically insulating layer, may optionally be formed over the fixed plate 2014 to isolate the fixed plate 2014 during an operational lifetime of the capacitive microphone. In FIG. 2B and following figures of the instant embodiment, boundary lines between the dielectric layers in the interconnect region 2008 are not shown for clarity.

Figure 2C:
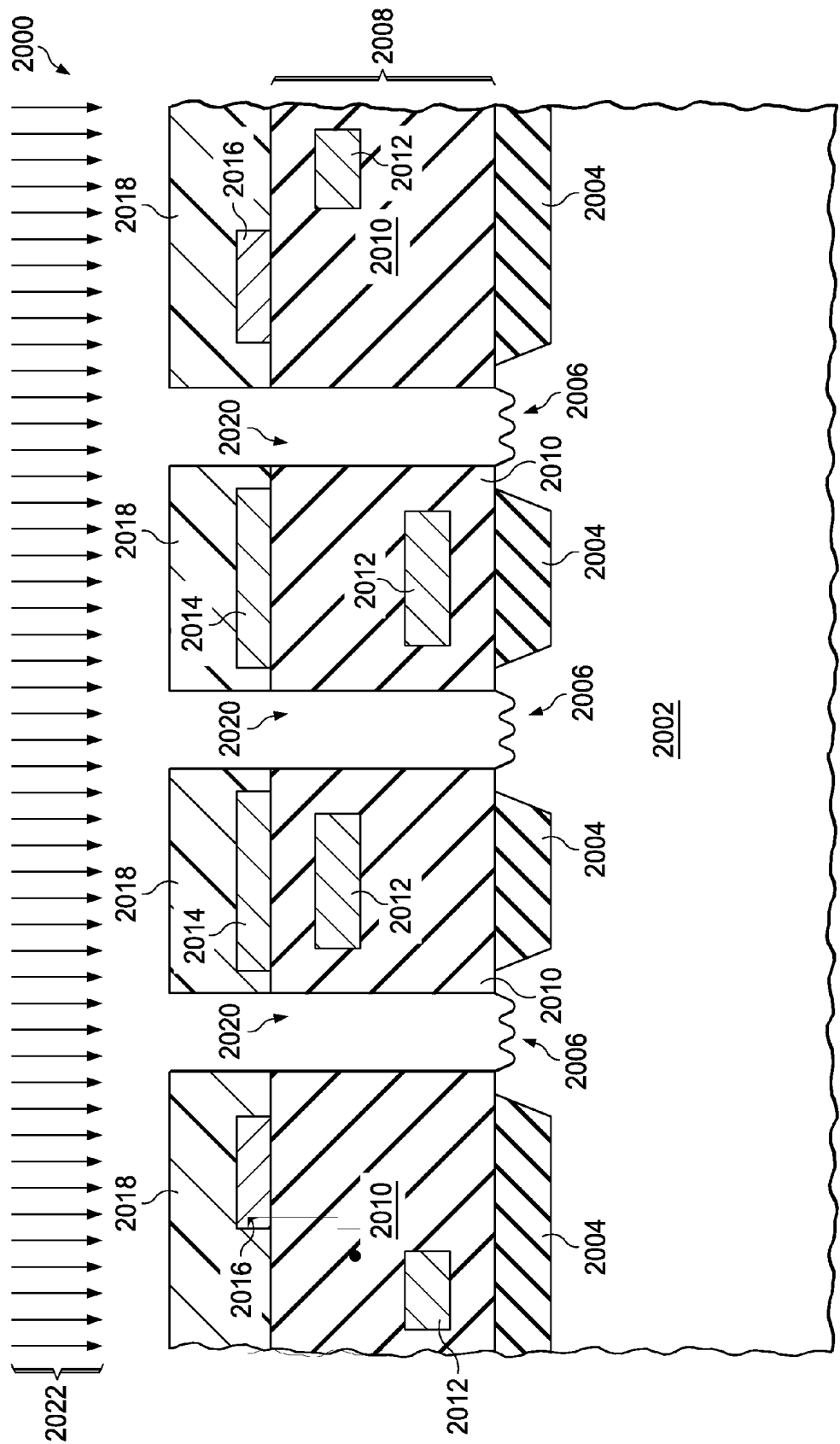

Referring to FIG. 2C, an access via photoresist pattern 2018 is formed on an existing top surface of the integrated circuit 2000 to define areas for access vias 2020 in the interconnect region 2008. An access via etch process 2022 removes dielectric material from the interconnect region 2008 to form the access vias 2020. In one realization of the instant embodiment, the access via etch process 2022 may be performed using a reactive ion etch (RIE) process, which directs reactive ions toward the top surface of the integrated circuit 2000. In one instance, the RIE process may include a fluorine containing plasma. The access vias 2020 extend to the semiconductor material in the substrate 2002 in the access holes 2006 through the field oxide 2004. The access via photoresist pattern 2018 is removed after formation of the access vias 2020 is complete, for example by exposing the integrated circuit 2000 to an oxygen containing plasma, followed by a wet cleanup to remove any organic residue from the top surface of the integrated circuit 2000.

Figure 2D:
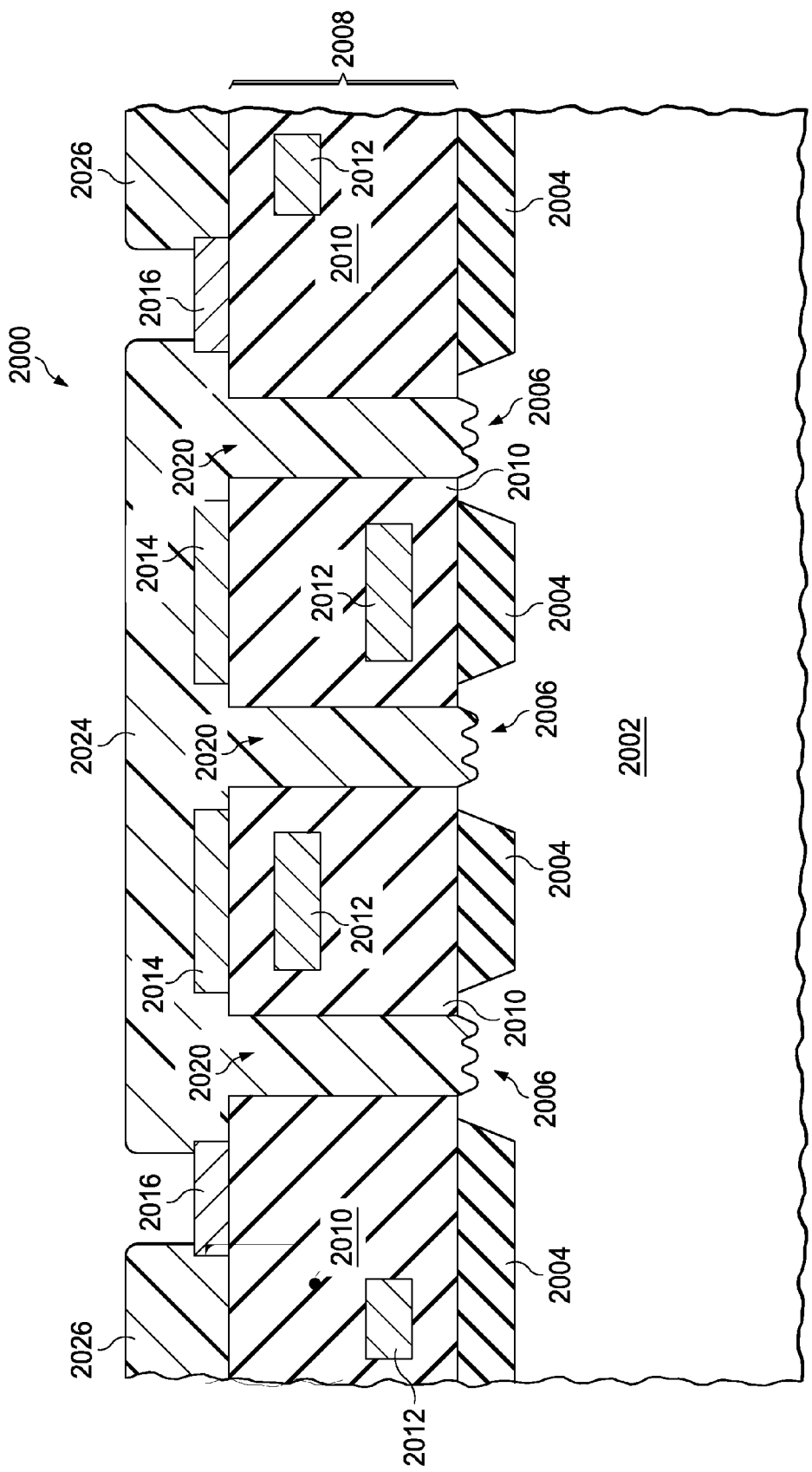

Referring to FIG. 2D, a capacitor cavity sacrificial layer 2024 is formed above the fixed plate 2014, as described in reference to FIG. 1D. Other processes to form the capacitor cavity sacrificial layer 2024 are within the scope of the instant embodiment. The capacitor cavity sacrificial layer 2024 includes sacrificial material such as photoresist or polyimide. In one realization of the instant embodiment, additional sacrificial material 2026 may be formed outside an area defined for the capacitive microphone. The sacrificial material of the capacitor cavity sacrificial layer 2024 extends into the access vias 2020, and may fill the access vias 2020 as depicted in FIG. 2D.

Figure 2E:
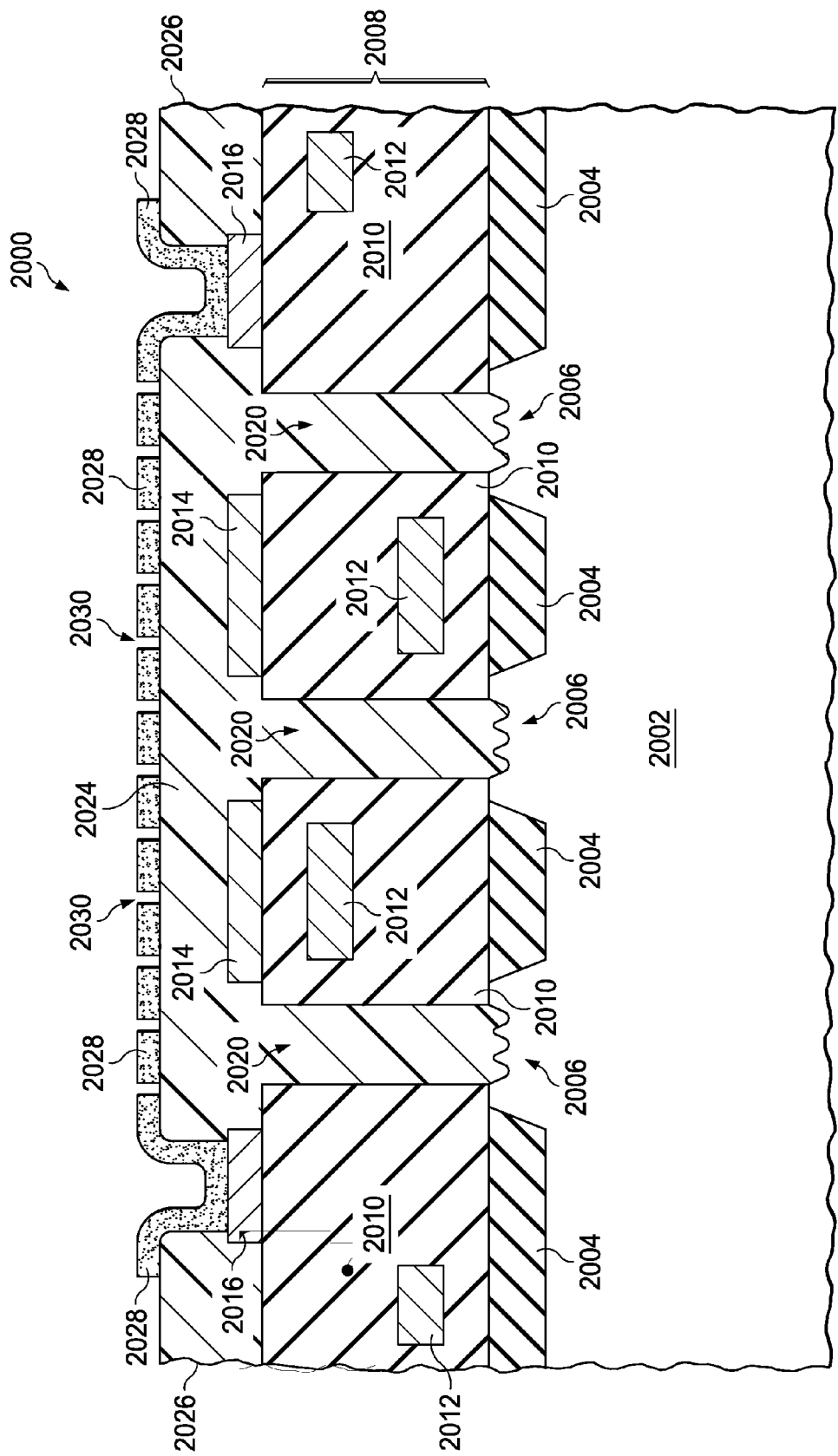

Referring to FIG. 2E, a contiguous permeable membrane 2028 is formed on the capacitor cavity sacrificial layer 2024, as described in reference to FIG. 1E. Membrane holes 2030 are formed in the permeable membrane 2028 as described in reference to FIG. 1E. In one realization of the instant embodiment, a vertical separation between a bottom surface of the permeable membrane 2028 and a top surface of the fixed plate 2014 is less than 200 nanometers. In an alternate realization of the instant embodiment, vertical separation between the bottom surface of the permeable membrane 2028 and the top surface of the fixed plate 2014 is less than 100 nanometers.

Figure 2F:
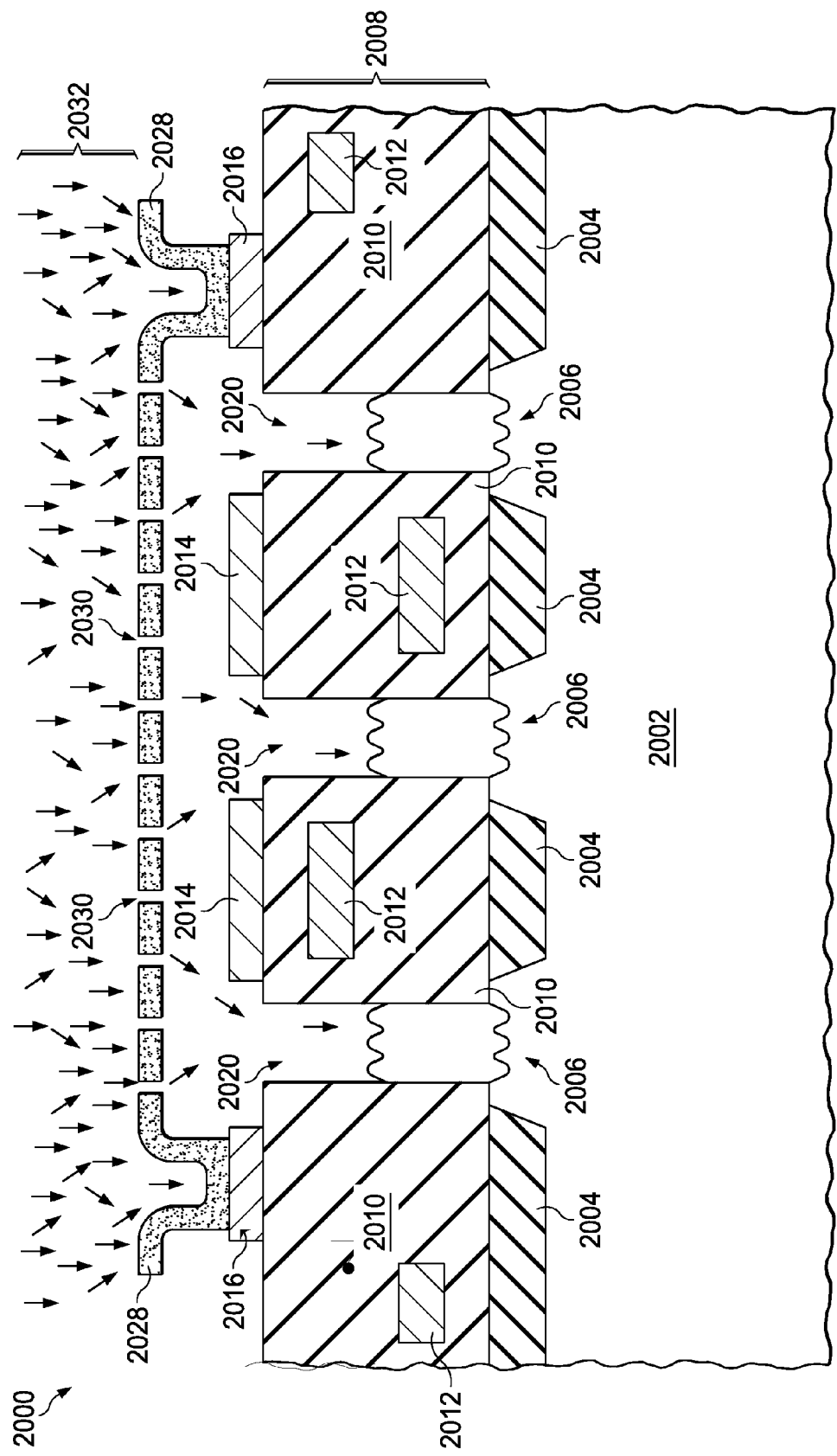

Referring to FIG. 2F, a sacrificial layer removal process 2032 is performed to remove sacrificial material from the capacitor cavity sacrificial layer 2024, as described in reference to FIG. 1F. In the instant embodiment, sacrificial material is removed from the access vias 2020.

Figure 2G:
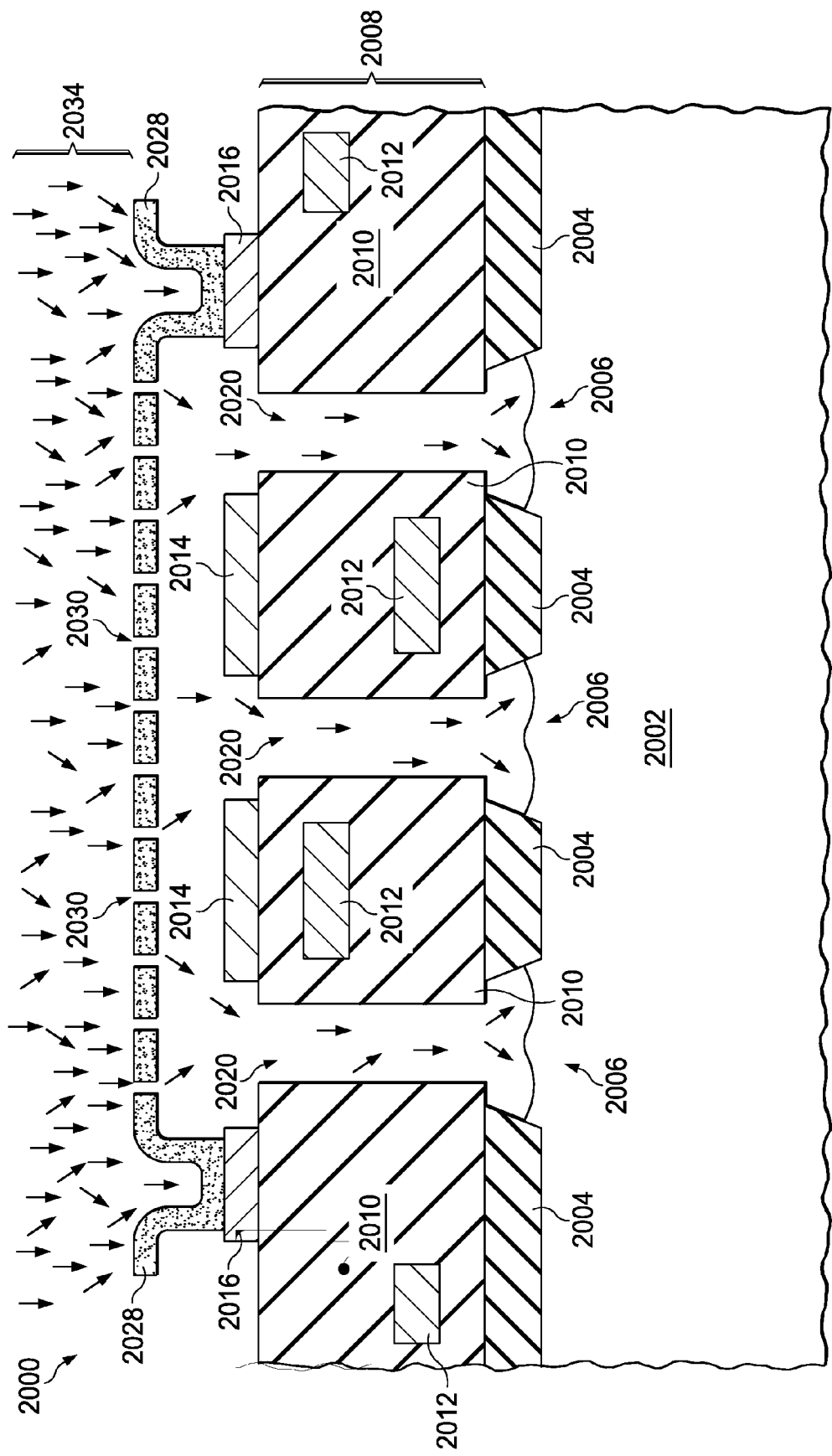

Referring to FIG. 2G, a cavity formation process 2034 is performed to provide reactive species through the membrane holes 2030 to the substrate 2002, as described in reference to FIG. 1G. Reactive species from the cavity formation process 2034 diffuse through the access vias 2020 and remove semiconductor material from the substrate 2002 as described in reference to FIG. 1G and FIG. 1H.

Figure 2H:
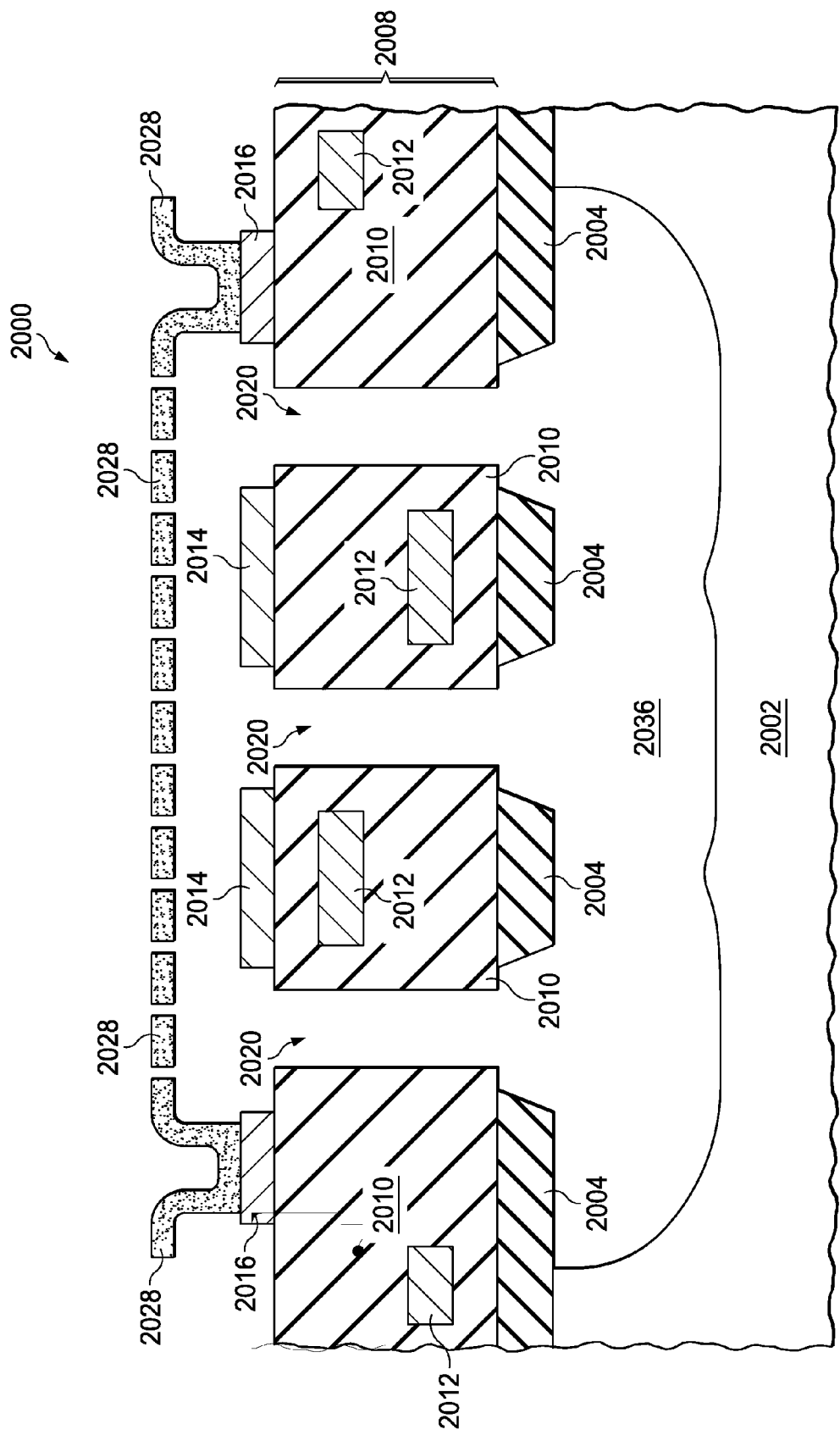

FIG. 2H depicts the integrated circuit 2000 after formation of the capacitive microphone is substantially complete. A back side cavity 2036 has been formed in the substrate 2002 under the field oxide 2004 of the integrated circuit 2000, such that a bottom of the back side cavity 2036 is within the substrate 2002. A protective coating (not shown) may optionally be formed on exposed surfaces of the membrane 2028 and the back side cavity 2036 for protection during an operational lifetime of the capacitive microphone. The back-side cavity connects to a space between the fixed plate 2014 and the membrane 2028 through the access holes 2006 and the access vias 2020. In one realization of the instant embodiment, the back side cavity 2036 may extend laterally beyond the membrane 2028. In one realization of the instant embodiment, a sum of a volume of the back side cavity 2036 and a volume of the access vias 2020 is more than 100 times as large as a volume of the space between the fixed plate 2014 and the membrane 2028. In a further embodiment, the sum of the volume of the back side cavity 2036 and the volume of the access vias 2020 is more than 1000 times as large as the volume of the space between the fixed plate 2014 and the membrane 2028.

Figure 3A:
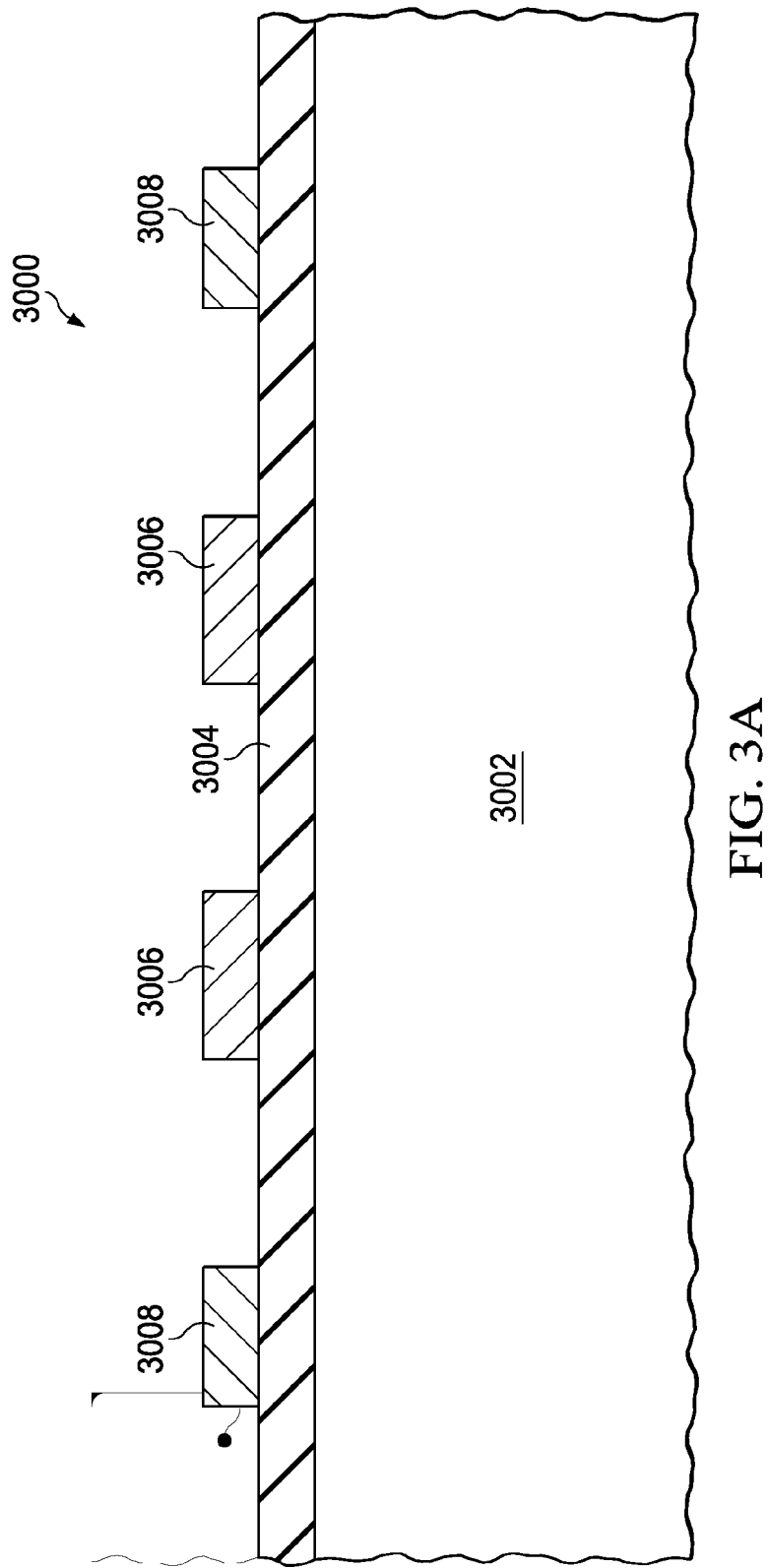
FIGS. 3A through 3H are cross-sectional views of an integrated circuit containing a capacitive microphone formed according to a third embodiment, depicted in successive stages of fabrication.

FIGS. 3A through 3H are cross-sectional views of an integrated circuit containing a capacitive microphone formed according to a third embodiment, depicted in successive stages of fabrication. Referring to FIG. 3A, the integrated circuit 3000 is formed in and on a substrate 3002 as described in reference to FIG. 1A. In the instant embodiment, a dielectric support layer 3004 is formed on a top surface of the substrate 3002 in an area defined for the capacitive microphone. In one realization of the instant embodiment, the dielectric support layer 3004 may extend across the entire top surface of the integrated circuit 3000. A fixed plate 3006 is formed above the dielectric support layer 3004. The fixed plate 3006 provides one capacitor plate of the capacitive microphone. Optional membrane terminals 3008 may be formed concurrently with the fixed plate 3006, as depicted in FIG. 3A, or may be formed in other fabrication steps. In one realization of the instant embodiment, the fixed plate 3006 and optional membrane terminals 3008, if formed, may be fully silicided polycrystalline silicon. In other realizations of the instant embodiment, the fixed plate 3006 and optional membrane terminals 3008, if formed, may be a metal such as tungsten or aluminum. In one realization, the fixed plate 3006 may be less than 100 microns wide. A protective layer (not shown), possibly an electrically insulating layer, may optionally be formed over the fixed plate 3006 to isolate the fixed plate 3006 during an operational lifetime of the capacitive microphone.

Figure 3B:
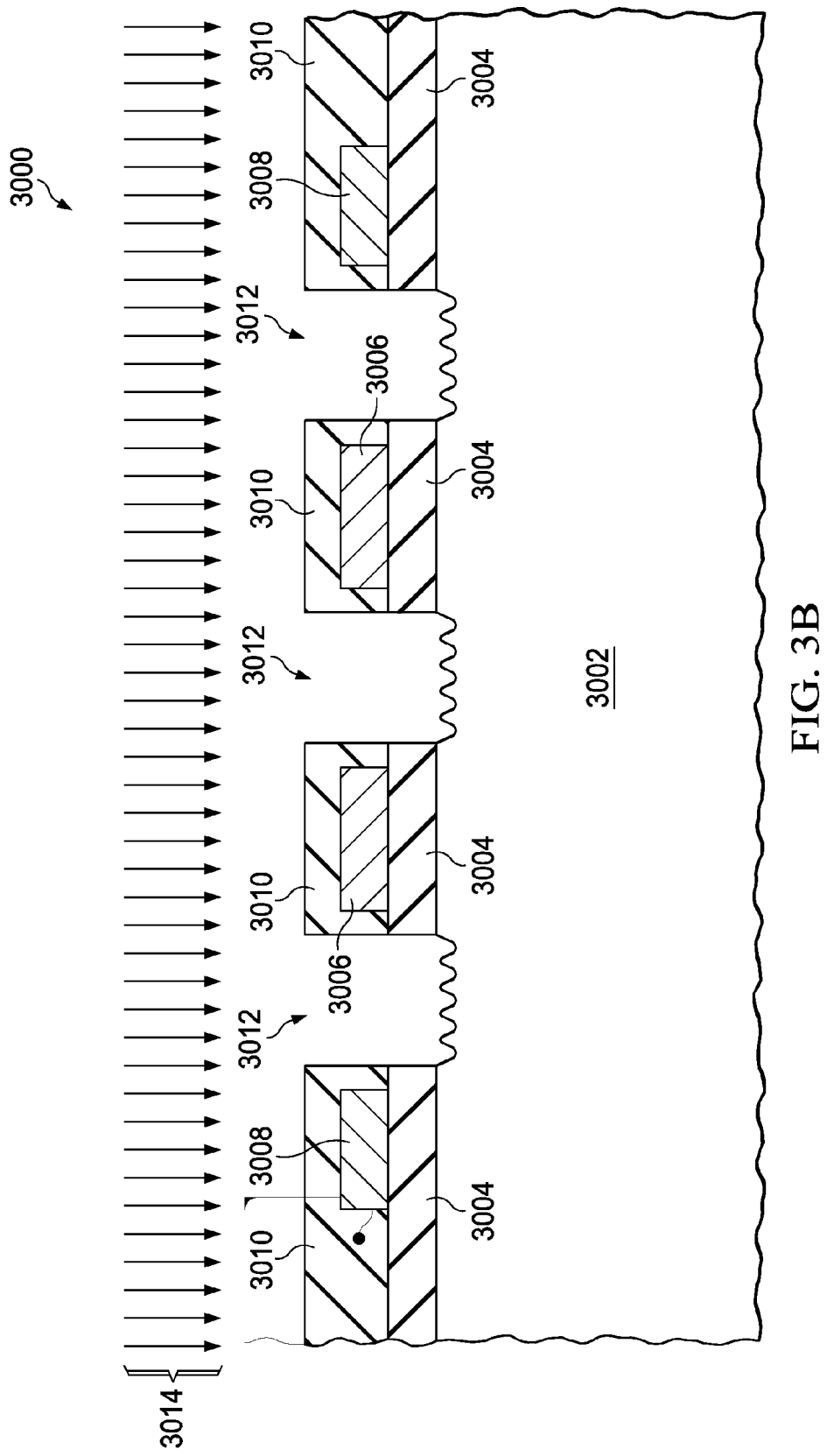

Referring to FIG. 3B, an access hole photoresist pattern 3010 is formed on an existing top surface of the integrated circuit 3000 to define areas for access holes 3012 adjacent to the fixed plate 3006 through the dielectric support layer 3004. An access hole etch process 3014 removes dielectric material from the dielectric support layer 3004 to expose the substrate 3002 in the access holes 3012. In one realization of the instant embodiment, the access hole etch process 3014 may include an RIE process with a fluorine containing plasma. In another realization, the access hole etch process 3014 may be performed using a wet etch, for example a dilute, possibly buffered, solution of hydrofluoric acid. After the access holes 3012 are formed, the access hole photoresist pattern 3010 is removed, for example by exposing the integrated circuit 3000 to an oxygen containing plasma, followed by a wet cleanup to remove any organic residue from the top surface of the integrated circuit 3000.

Figure 3C:
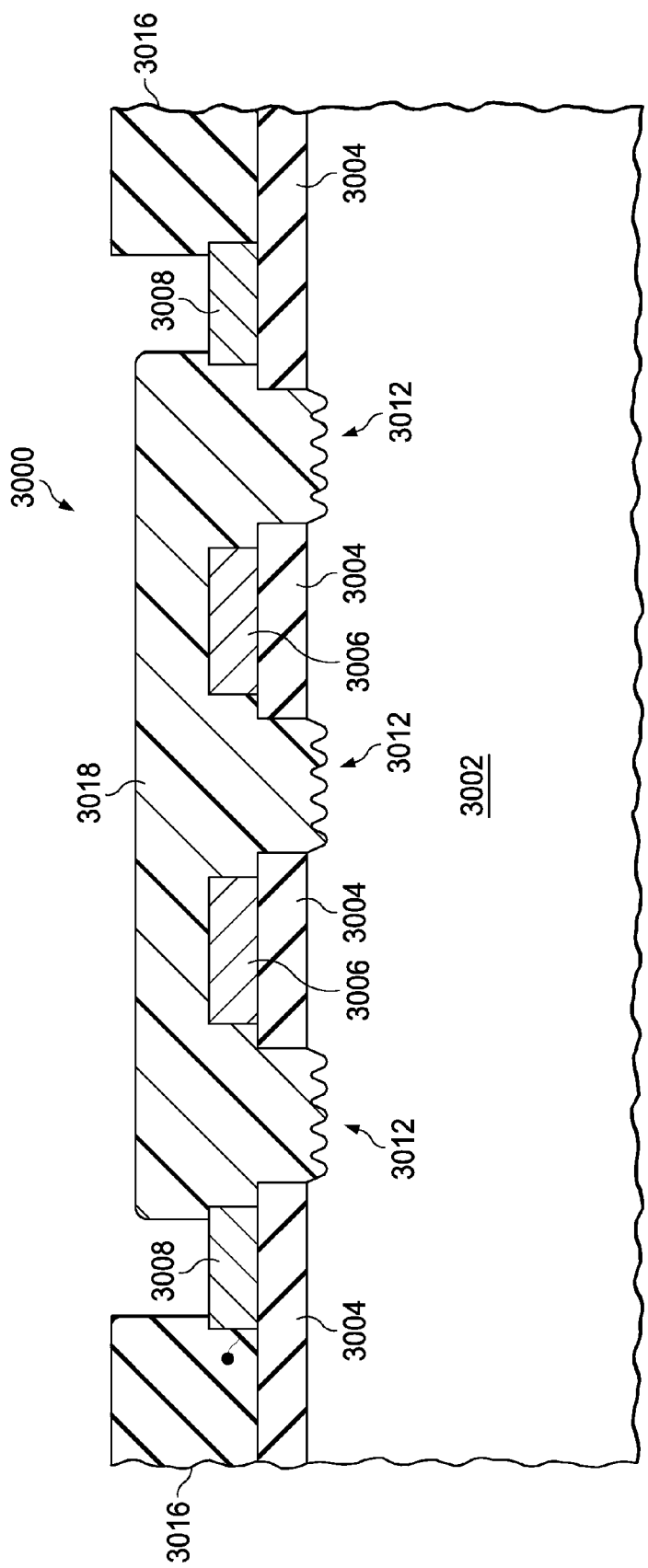

Referring to FIG. 3C, optional interconnect and dielectric levels 3016 may be formed above the substrate 2002, as described in reference to FIG. 1C. A capacitor cavity sacrificial layer 3018 is formed above the fixed plate 3006 as described in reference to FIG. 1D. Other processes to form the capacitor cavity sacrificial layer 3018 are within the scope of the instant embodiment. The capacitor cavity sacrificial layer 3018 includes sacrificial material such as photoresist or polyimide. The sacrificial material extends into the access holes 3012.

Figure 3D:
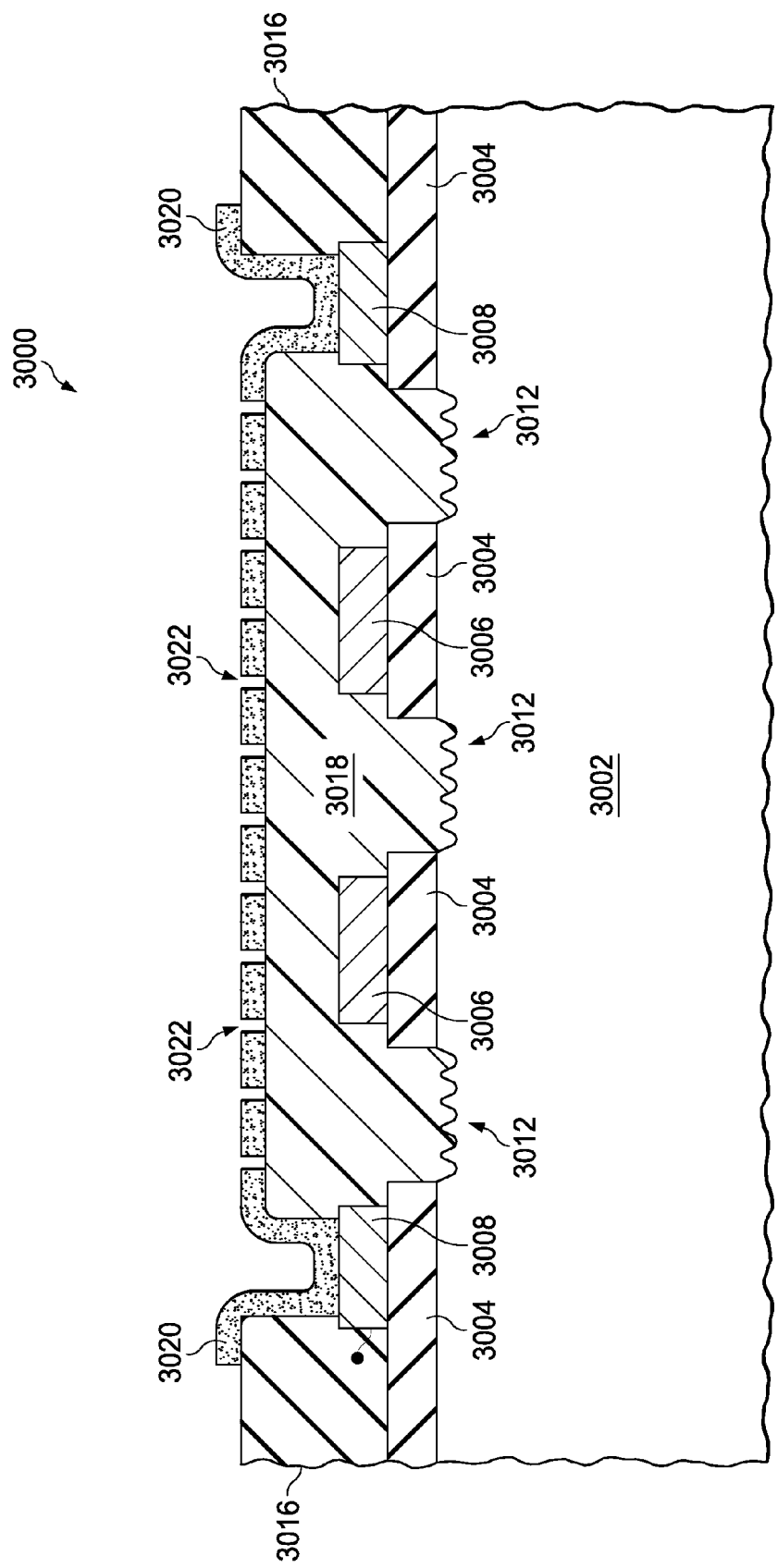

Referring to FIG. 3D, a contiguous permeable membrane 3020 is formed on the capacitor cavity sacrificial layer 3018, as described in reference to FIG. 1E. The permeable membrane 3020 provides a second capacitor plate of the capacitive microphone. Membrane holes 3022 are formed in the permeable membrane 3020. In one realization of the instant embodiment, a vertical separation between a bottom surface of the permeable membrane 3020 and a top surface of the fixed plate 3006 is less than 200 nanometers. In an alternate realization of the instant embodiment, vertical separation between the bottom surface of the permeable membrane 3020 and the top surface of the fixed plate 3006 is less than 100 nanometers.

Figure 3E:
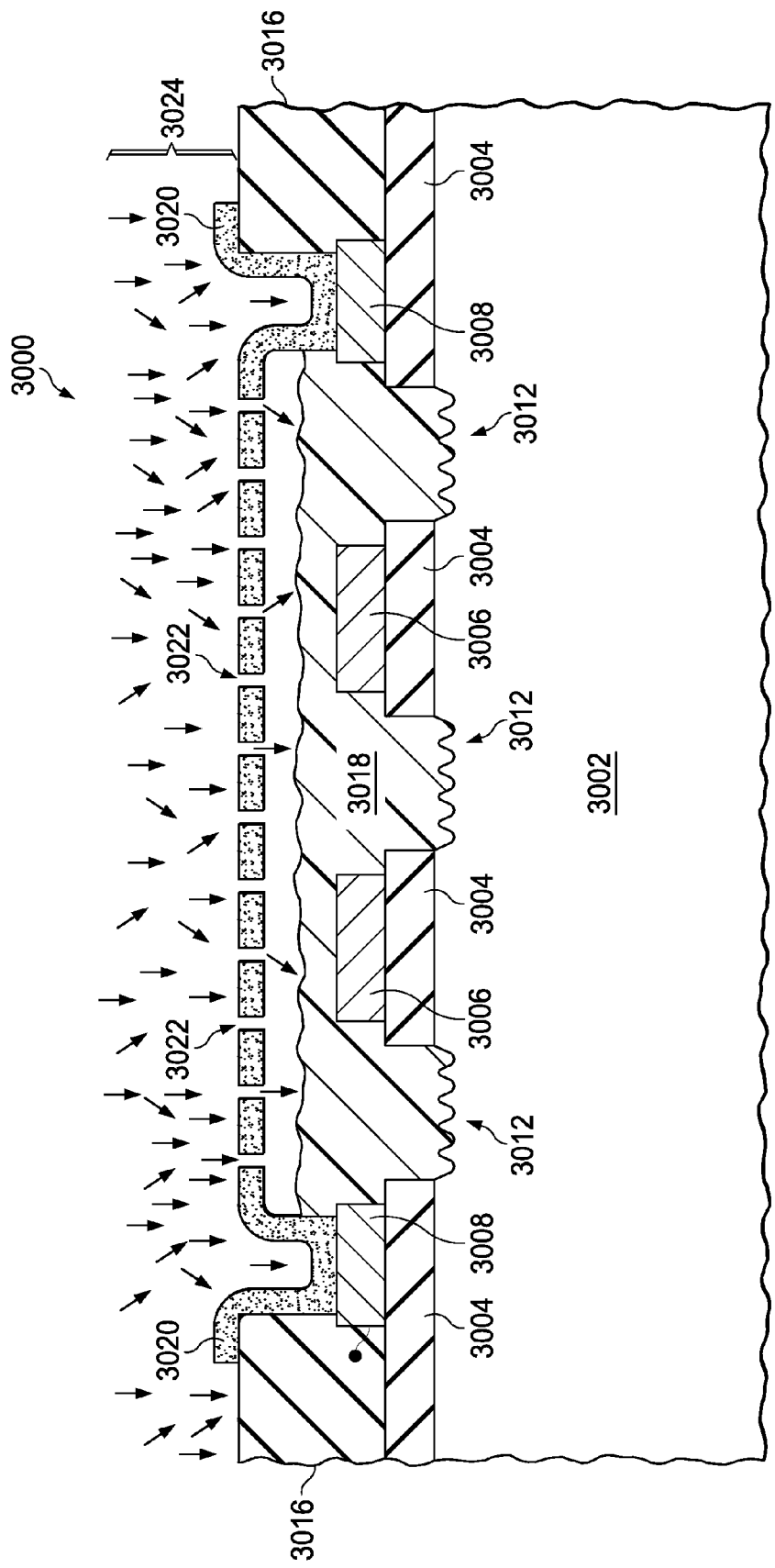
Figure 3F:
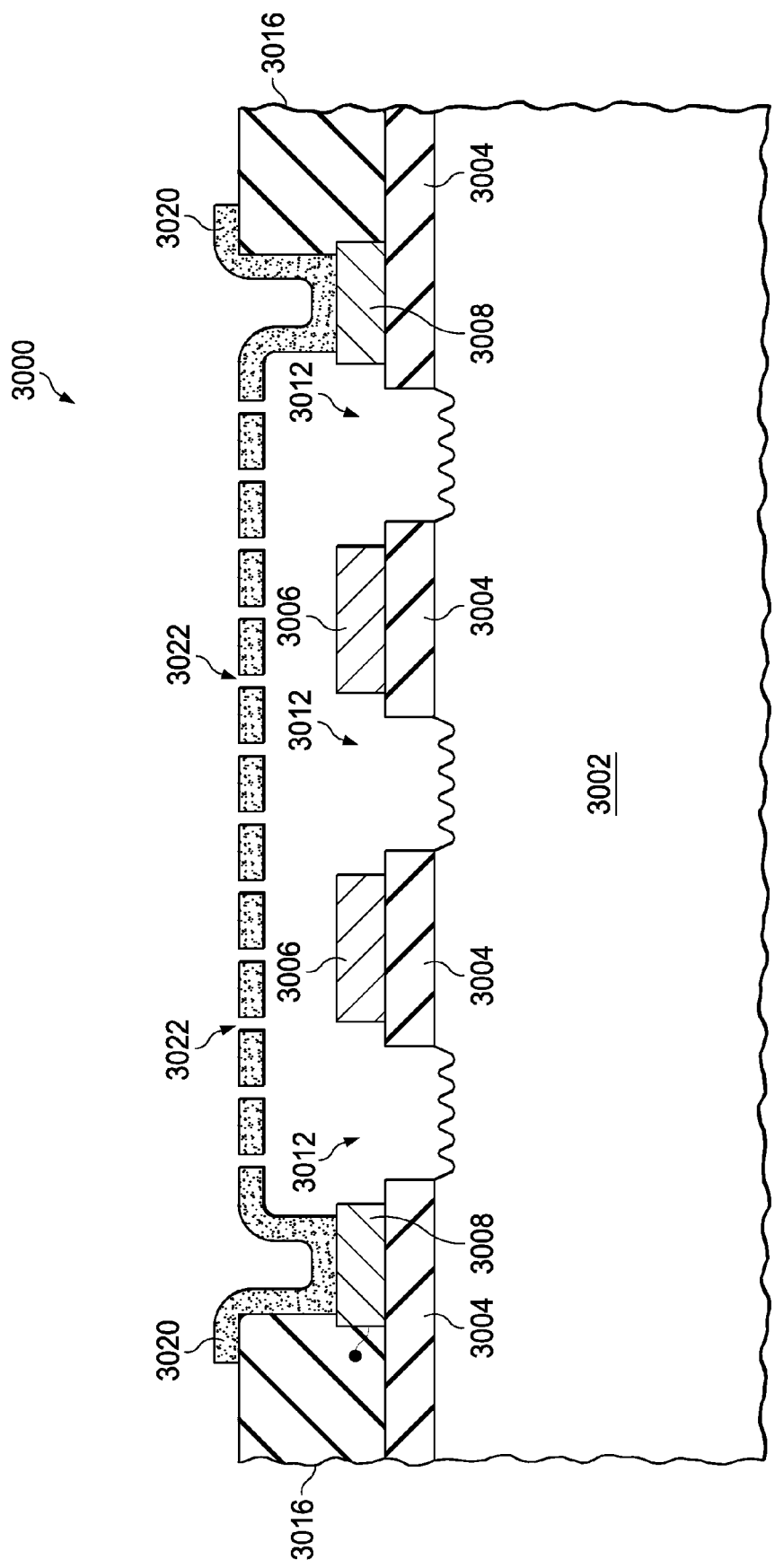

Referring to FIG. 3E, a sacrificial layer removal process 3024 is performed to remove sacrificial material from the capacitor cavity sacrificial layer 3018, as described in reference to FIG. 1F. The sacrificial layer removal process 3024 is continued until substantially all the sacrificial material is removed from the capacitor cavity sacrificial layer 3018, as depicted in FIG. 3F.

Figure 3G:
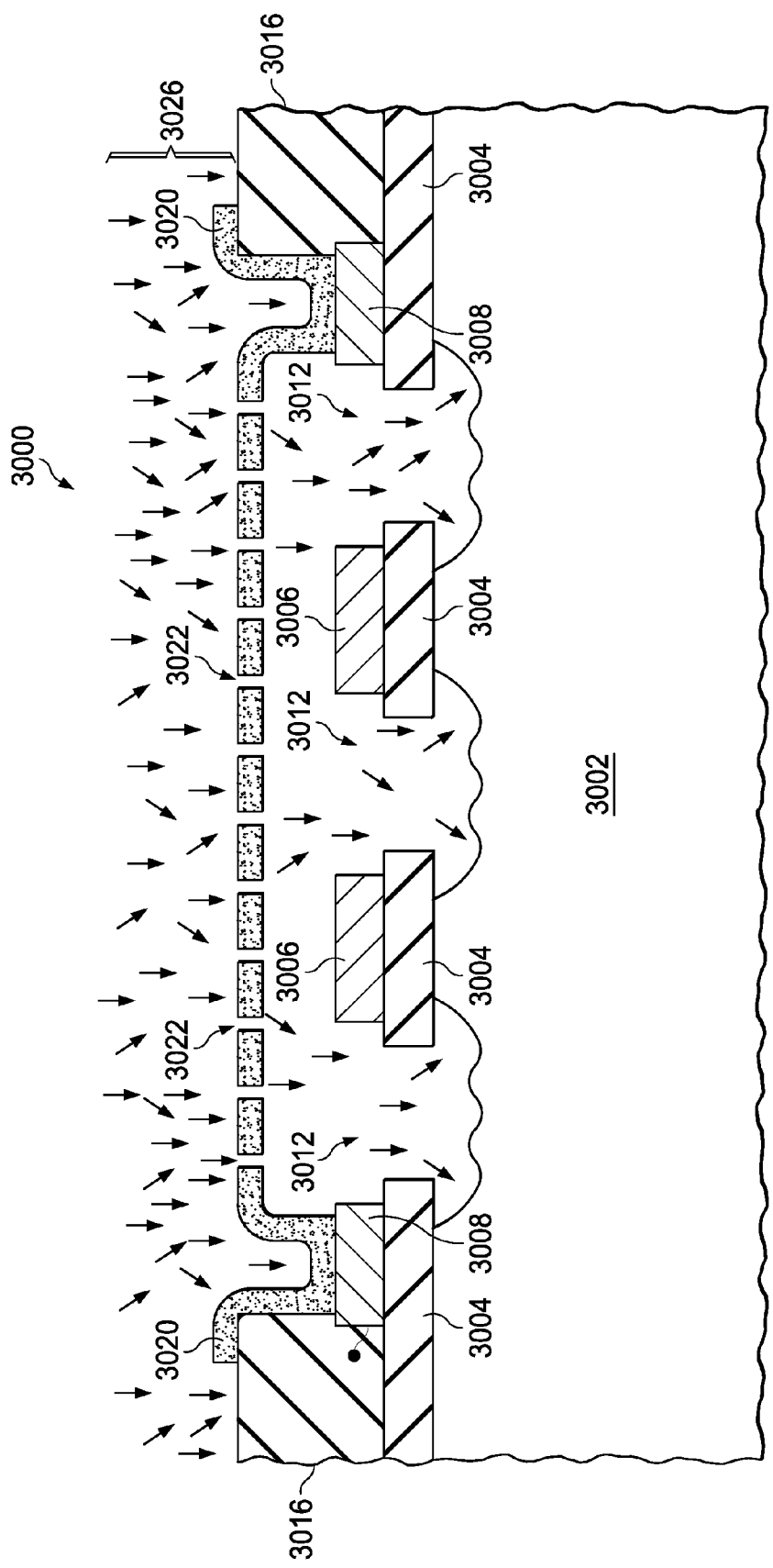

Referring to FIG. 3G, a cavity formation process 3026 is performed to provide reactive species through the membrane holes 3022 to the substrate 3002, as described in reference to FIG. 1G. Reactive species from the cavity formation process 3026 diffuse through the access holes 3012 and remove semiconductor material from the substrate 3002 as described in reference to FIG. 1G and FIG. 1H.

Figure 3H:
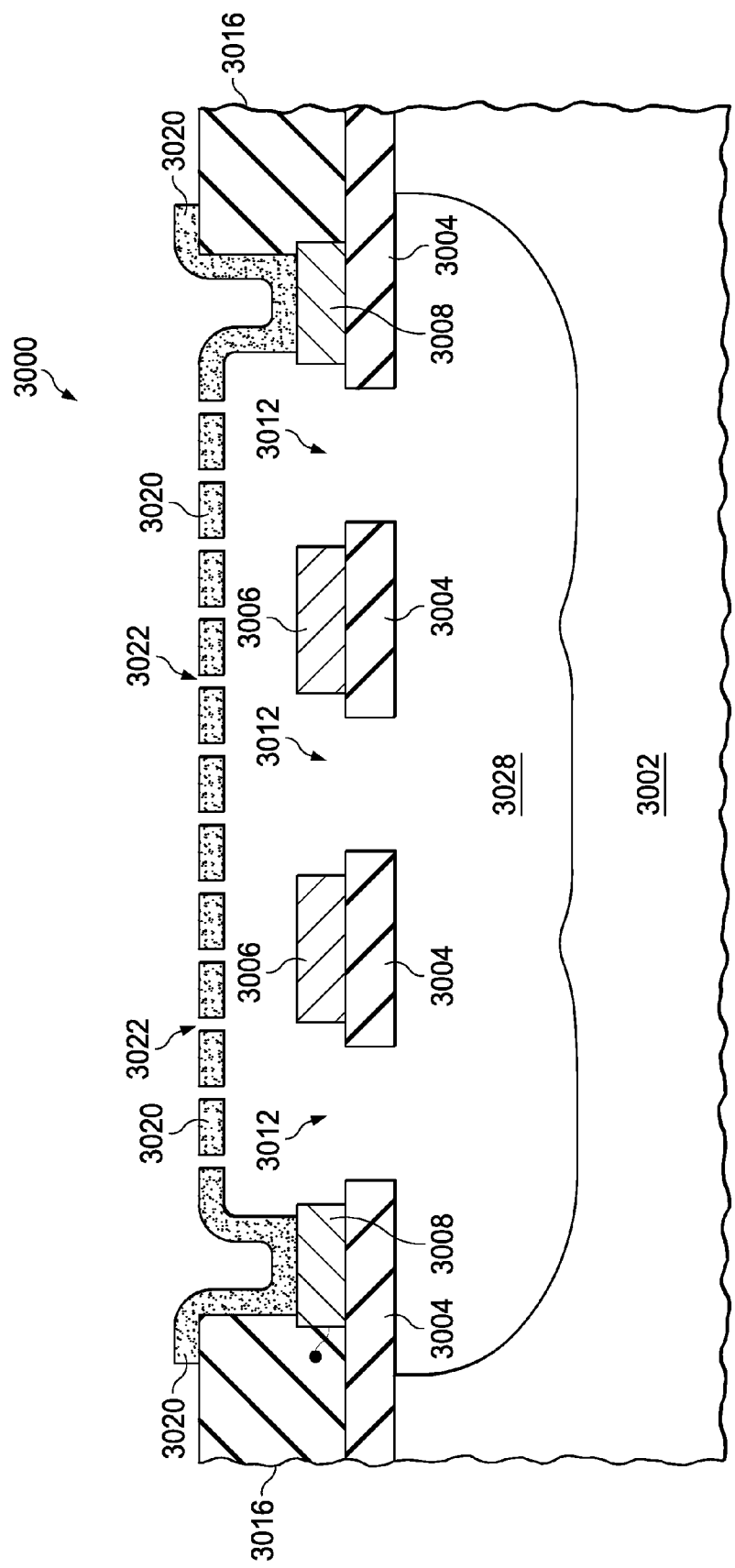

FIG. 3H depicts the integrated circuit 3000 after formation of the capacitive microphone is substantially complete. A back side cavity 3028 has been formed in the substrate 3002 under the dielectric support layer 3004, such that a bottom of the back side cavity 3028 is within the substrate 3002. A protective coating (not shown) may optionally be formed on exposed surfaces of the membrane 3020 and the back side cavity 3028 for protection during an operational lifetime of the capacitive microphone. The back-side cavity connects to a space between the fixed plate 3006 and the membrane 3020 through the access holes 3012. In one realization of the instant embodiment, the back side cavity 3028 may extend laterally beyond the membrane 3020. In one realization of the instant embodiment, a volume of the back side cavity 3028 is more than 100 times as large as a volume of the space between the fixed plate 3006 and the membrane 3020. In a further embodiment, the volume of the back side cavity 3028 is more than 1000 times as large as the volume of the space between the fixed plate 3006 and the membrane 3020.

Figure 4A:
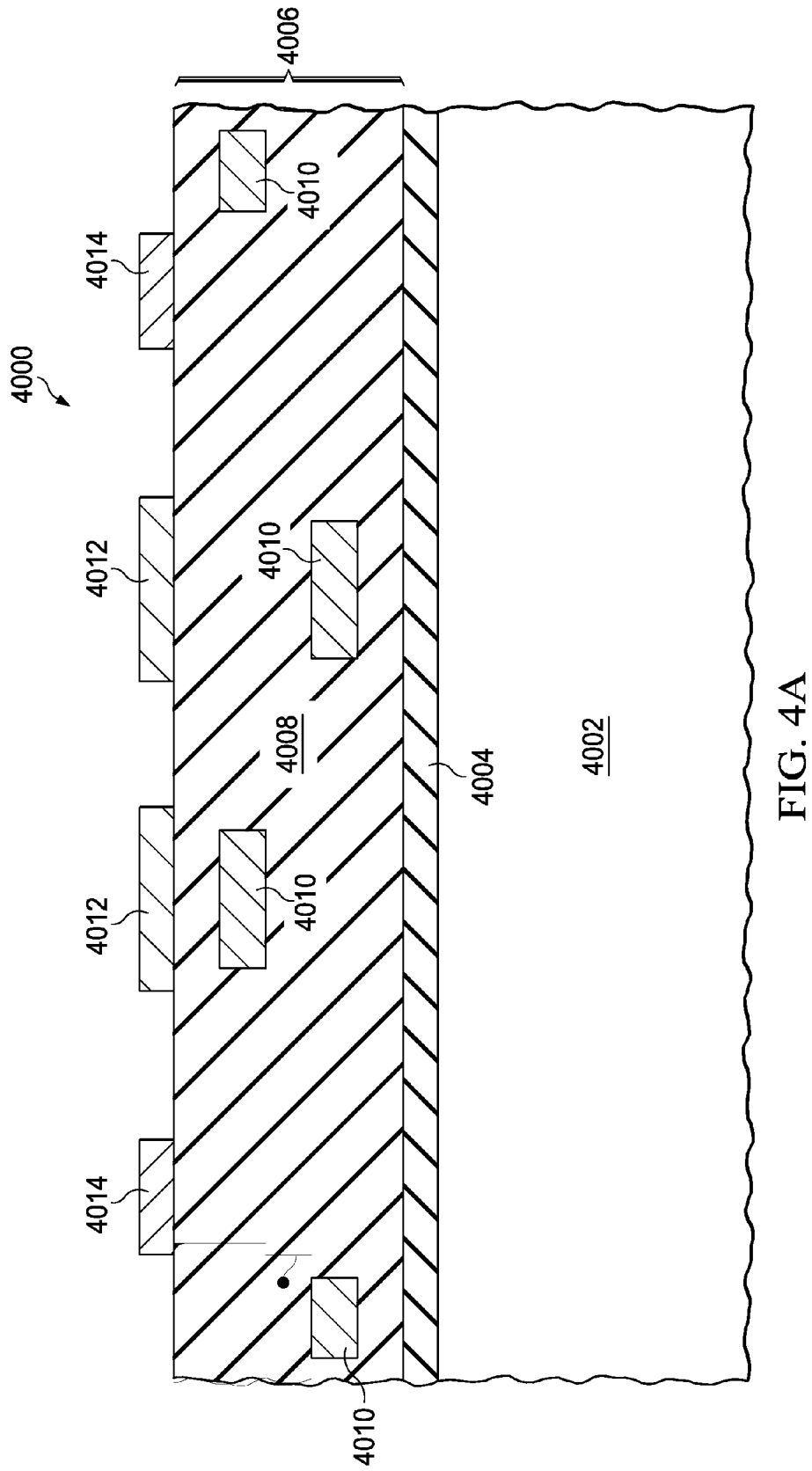
FIGS. 4A through 4G are cross-sectional views of an integrated circuit containing a capacitive microphone formed according to a third embodiment, depicted in successive stages of fabrication.

FIGS. 4A through 4G are cross-sections of an integrated circuit containing a capacitive microphone formed according to a third embodiment, depicted in successive stages of fabrication. Referring to FIG. 4A, the integrated circuit 4000 is formed in and on a substrate 4002 as described in reference to FIG. 1A. In the instant embodiment, a dielectric support layer 4004 is formed on a top surface of the substrate 4002 in an area defined for the capacitive microphone. In one realization of the instant embodiment, the dielectric support layer 4004 may extend across the entire top surface of the integrated circuit 4000. An interconnect region 4006 is formed above the dielectric support layer 4004, which includes dielectric layers 4008 and metal interconnect components 4010. In some realizations of the instant embodiment, no metal interconnect components 4010 are located in the area defined for the capacitive microphone. In FIG. 4A and following figures of the instant embodiment, boundary lines between the dielectric layers in the interconnect region 4006 are not shown for clarity. A fixed plate 4012 is formed above the interconnect region 4006 in a region defined for the capacitive microphone. In one realization of the instant embodiment, the fixed plate 4012 is formed of similar materials as the metal interconnect components 4010 in the interconnect region 4006. Optional membrane terminals 4014 may be formed concurrently with the fixed plate 4012, as depicted in FIG. 4A, or may be formed in other fabrication steps. In one realization of the instant embodiment, the fixed plate 4012 and optional membrane terminals 4014, if present, include aluminum. In an alternate realization, the fixed plate 4012 and optional membrane terminals 4014, if present, include copper. A protective layer (not shown), possibly an electrically insulating layer, may optionally be formed over the fixed plate 4012 to isolate the fixed plate 4012 during an operational lifetime of the capacitive microphone.

Figure 4B:
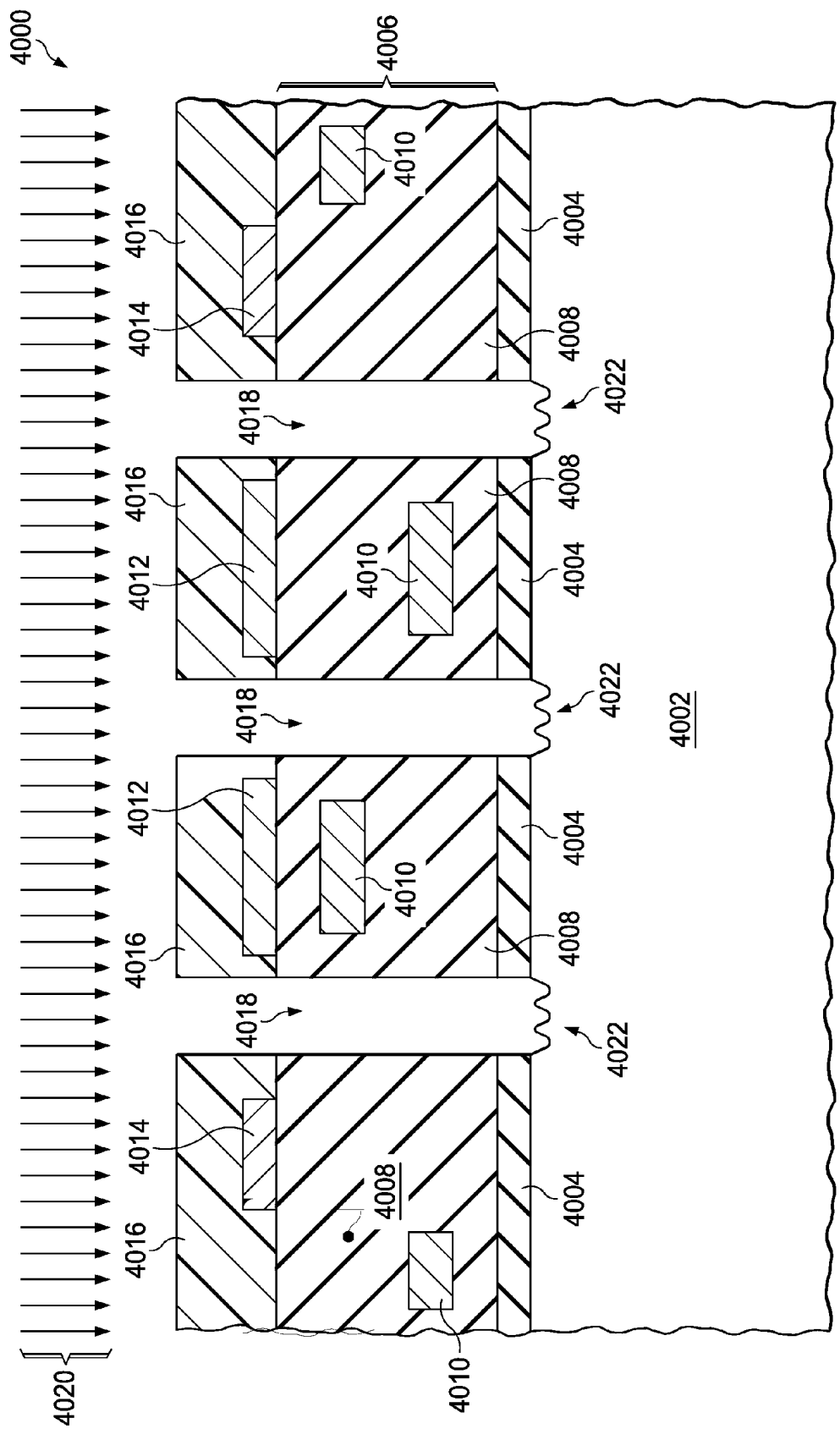

Referring to FIG. 4B, an access via photoresist pattern 4016 is formed on an existing top surface of the integrated circuit 4000 to define areas for access vias 4018 in the interconnect region 4006 and access holes 4022 through the dielectric support layer 4004. An access via etch process 4020 removes dielectric material from the interconnect region 4006 and the dielectric support layer 4004 to form the access vias 4018 through the interconnect region 4006 and access holes 4022 through the dielectric support layer 4004. In one realization of the instant embodiment, the access via etch process 4020 may be performed using an RIE process with a fluorine containing plasma. The access vias 4018 extend through the dielectric support layer 4004 to the semiconductor material in the substrate 4002. The access via photoresist pattern 4016 is removed after formation of the access vias 4018 is complete, as described in reference to FIG. 2C.

Figure 4C:
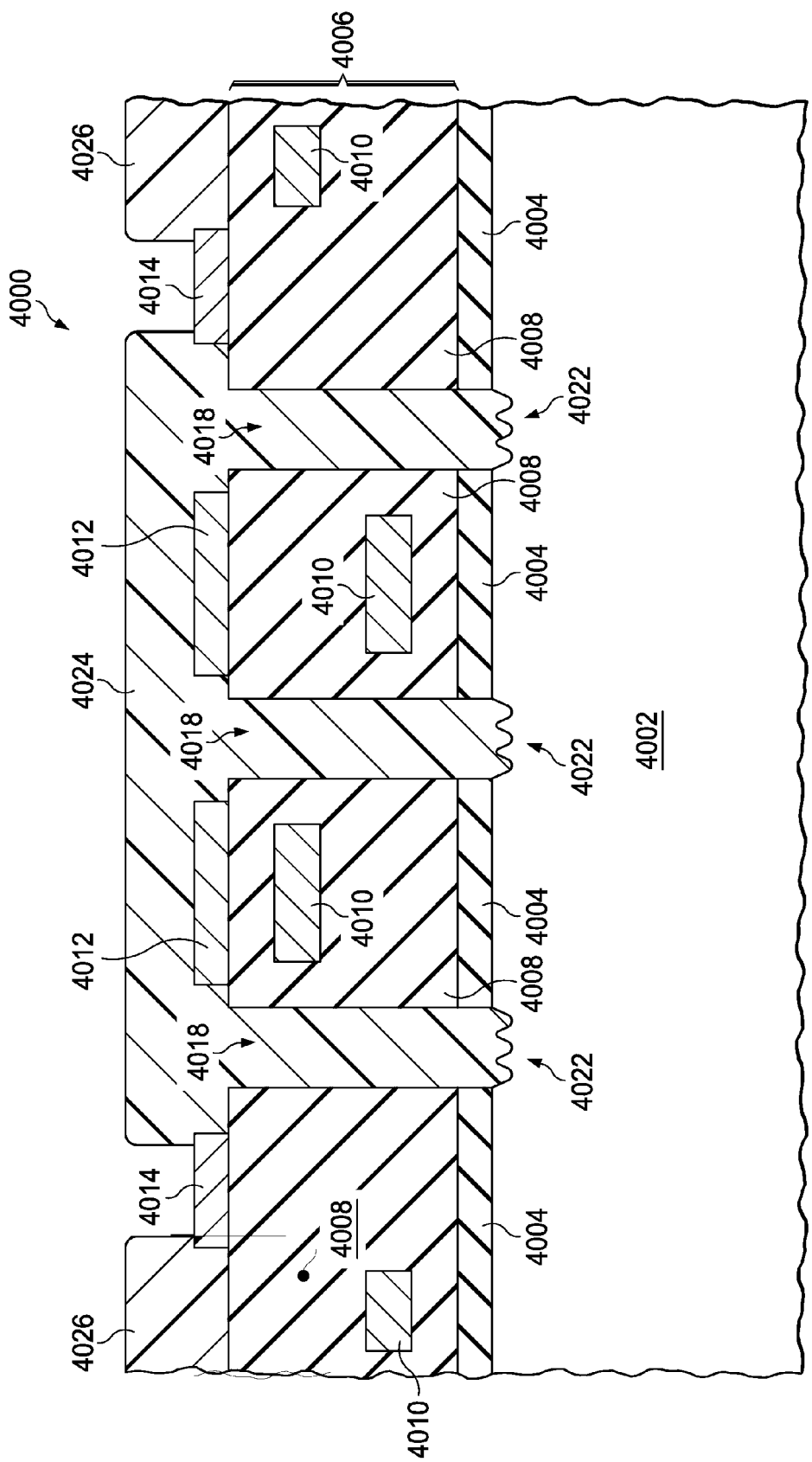

Referring to FIG. 4C, a capacitor cavity sacrificial layer 4024 is formed above the fixed plate 4012, as described in reference to FIG. 2D. The capacitor cavity sacrificial layer 4024 includes sacrificial material such as photoresist or polyimide. In one realization of the instant embodiment, additional sacrificial material 4026 may be formed outside the area defined for the capacitive microphone. The sacrificial material of the capacitor cavity sacrificial layer 4024 extends into the access vias 4018, and may fill the access vias 4018 as depicted in FIG. 4C.

Figure 4D:
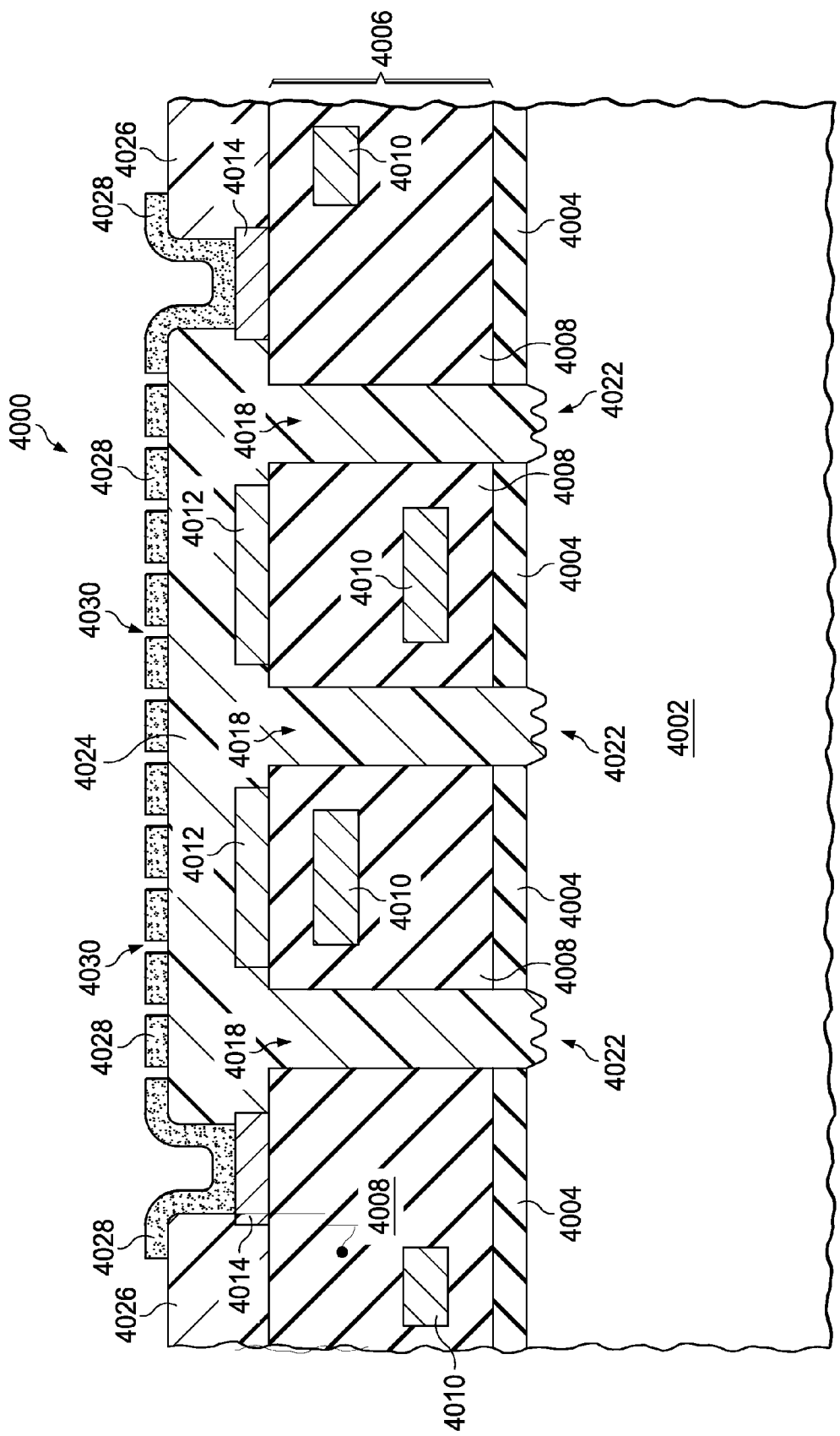

Referring to FIG. 4D, a contiguous permeable membrane 4028 is formed on the capacitor cavity sacrificial layer 4024, as described in reference to FIG. 1E. Membrane holes 4030 are formed in the permeable membrane 4028 as described in reference to FIG. 1E. In one realization of the instant embodiment, a vertical separation between a bottom surface of the permeable membrane 4028 and a top surface of the fixed plate 4012 is less than 200 nanometers. In an alternate realization, the vertical separation between the bottom surface of the permeable membrane 4028 and the top surface of the fixed plate 4012 is less than 100 nanometers.

Figure 4E:
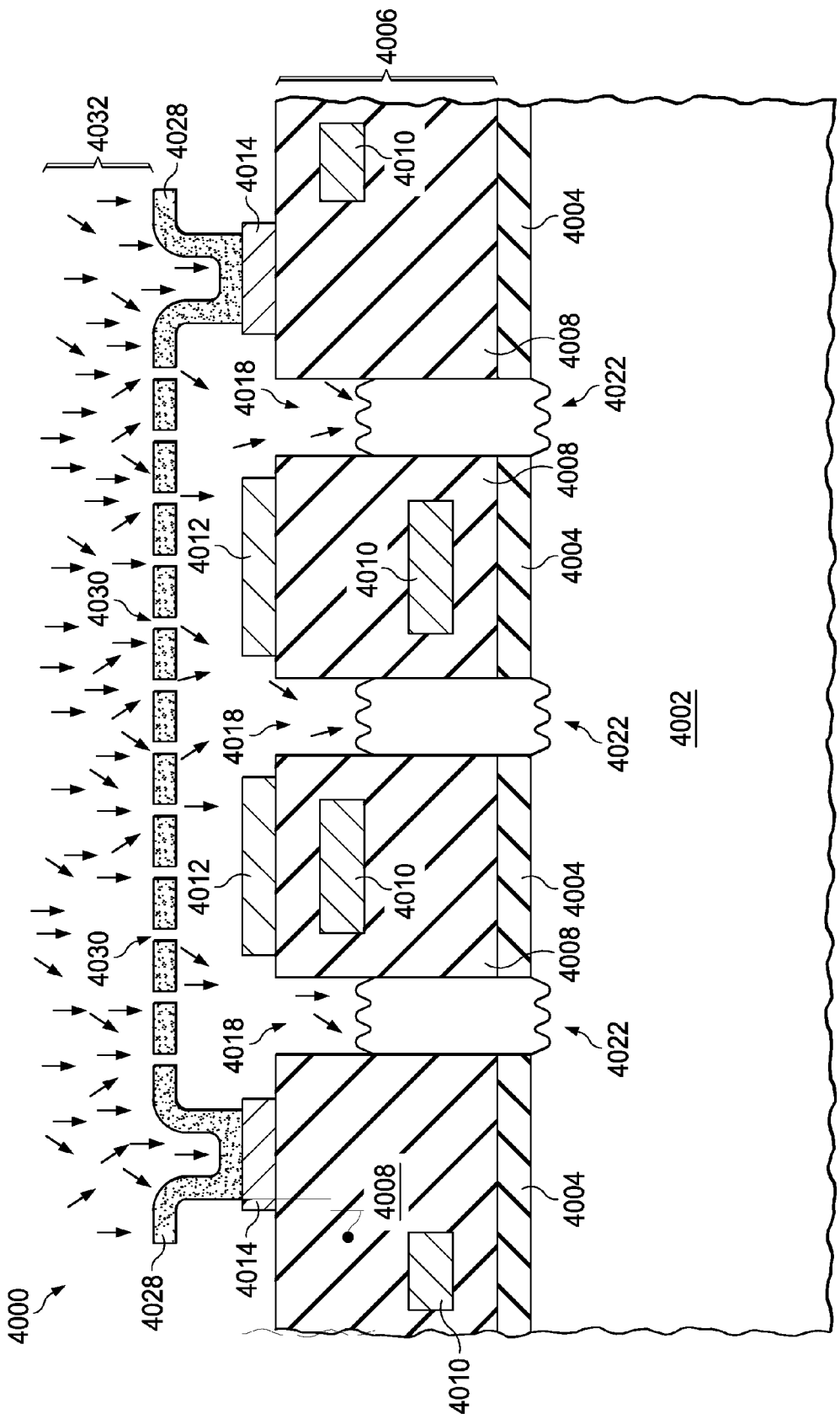

Referring to FIG. 4E, a sacrificial layer removal process 4032 is performed to remove sacrificial material from the capacitor cavity sacrificial layer, as described in reference to FIG. 1F. In the instant embodiment, sacrificial material is removed from the access vias 4018.

Figure 4F:
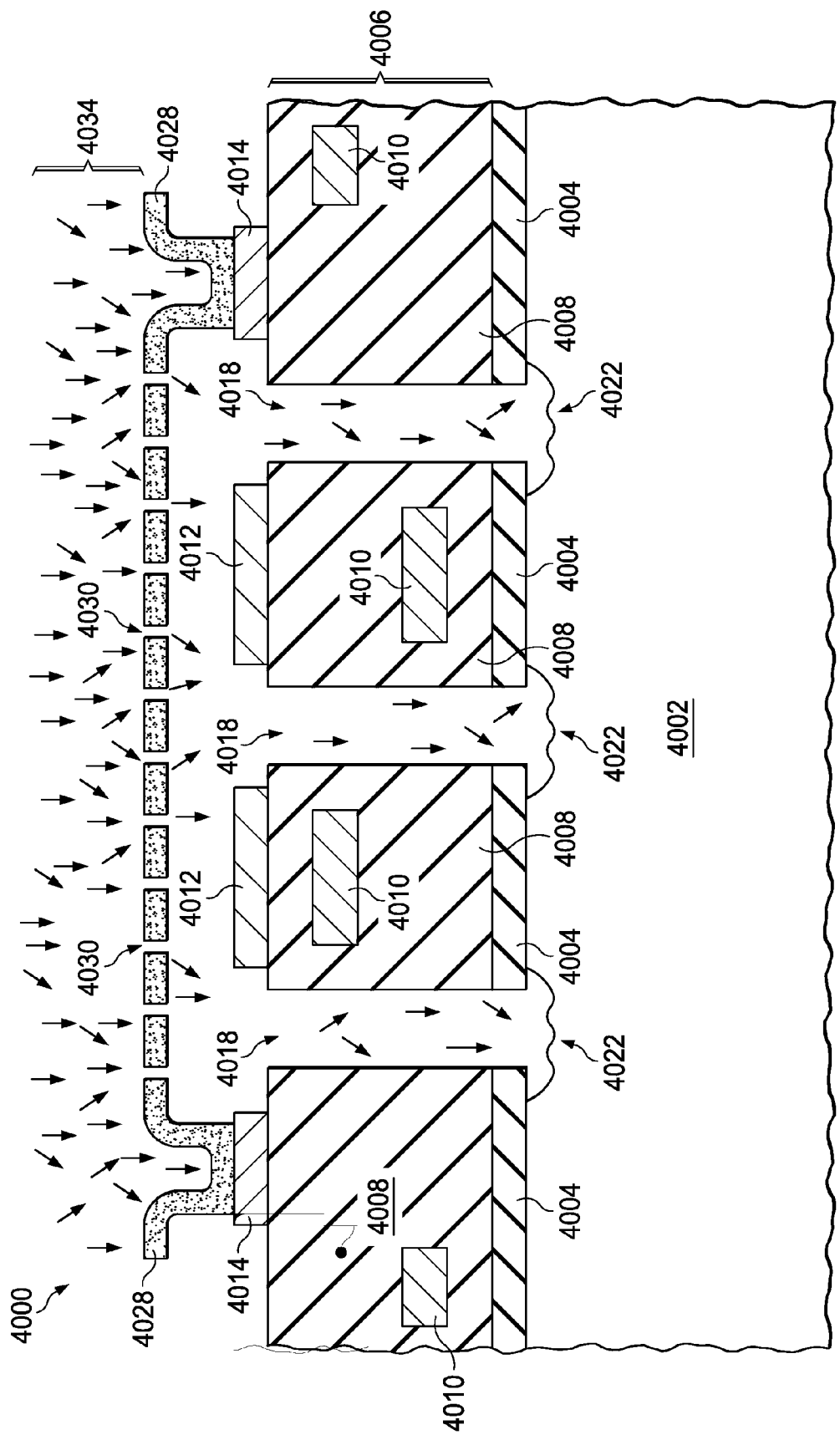

Referring to FIG. 4F, a cavity formation process 4034 is performed to provide reactive species through the membrane holes 4030 to the substrate 4002, as described in reference to FIG. 1G. Reactive species from the cavity formation process 4034 diffuse through the access vias 4018 and remove semiconductor material from the substrate 4002 as described in reference to FIG. 1G and FIG. 1H.

Figure 4G:
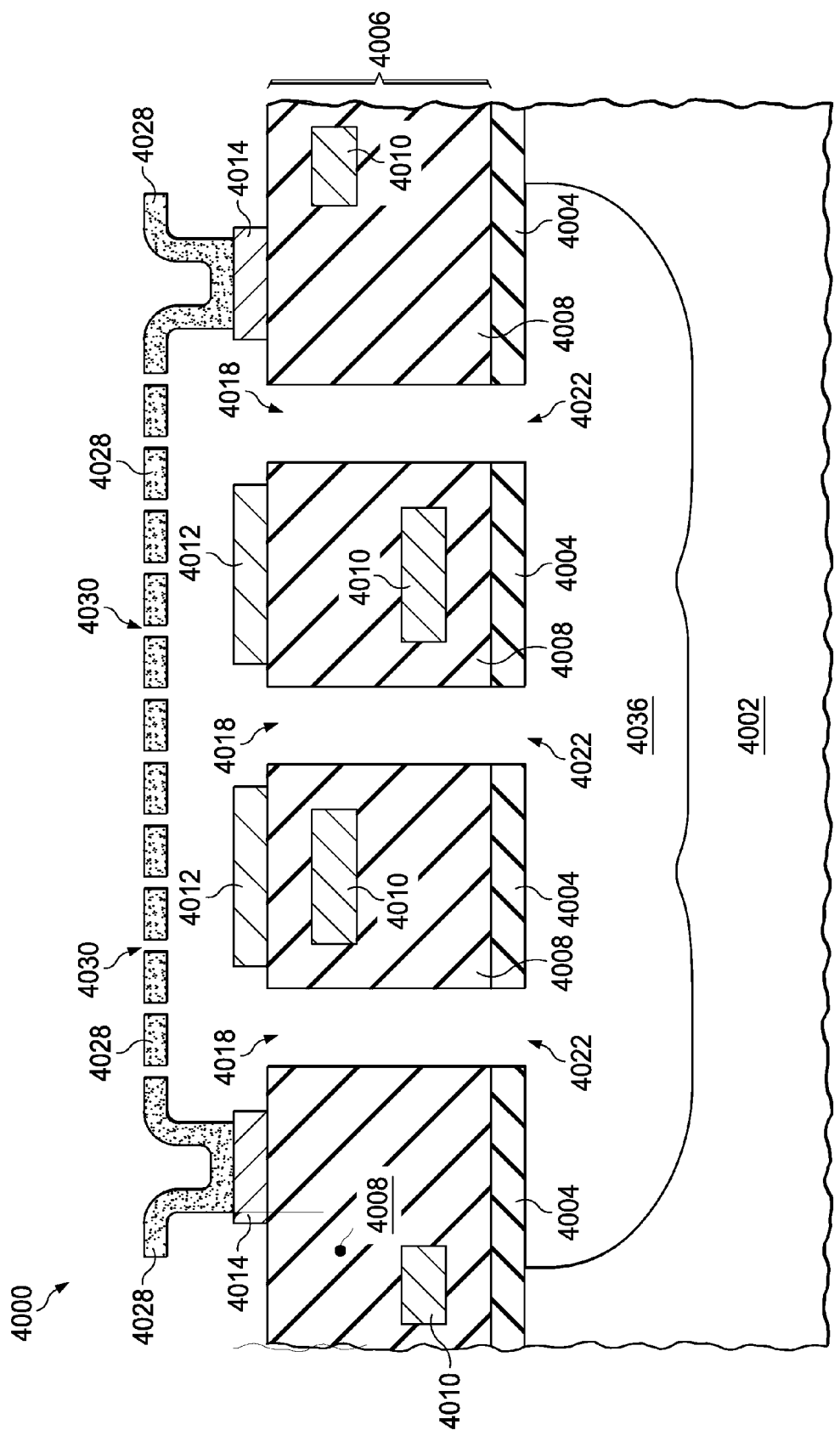

FIG. 4G depicts the integrated circuit 4000 after formation of the capacitive microphone is substantially complete. A back side cavity 4036 has been formed in the substrate 4002 under the dielectric support layer 4004, such that a bottom of the back side cavity 4036 is within the substrate 4002. A protective coating (not shown) may optionally be formed on exposed surfaces of the membrane 4028 and the back side cavity 4036 for protection during an operational lifetime of the capacitive microphone. The back-side cavity 4036 connects to a space between the fixed plate 4012 and the membrane 4028 through the access vias 4018. In one realization of the instant embodiment, the back side cavity 4036 may extend laterally beyond the membrane 4028. In one realization of the instant embodiment, a sum of a volume of the back side cavity 4036 and a volume of the access vias 4018 is more than 100 times as large as a volume of the space between the fixed plate 4012 and the membrane 4028. In a further embodiment, the sum of the volume of the back side cavity 4036 and the volume of the access vias 4018 is more than 1000 times as large as the volume of the space between the fixed plate 4012 and the membrane 4028.

Figure 5:
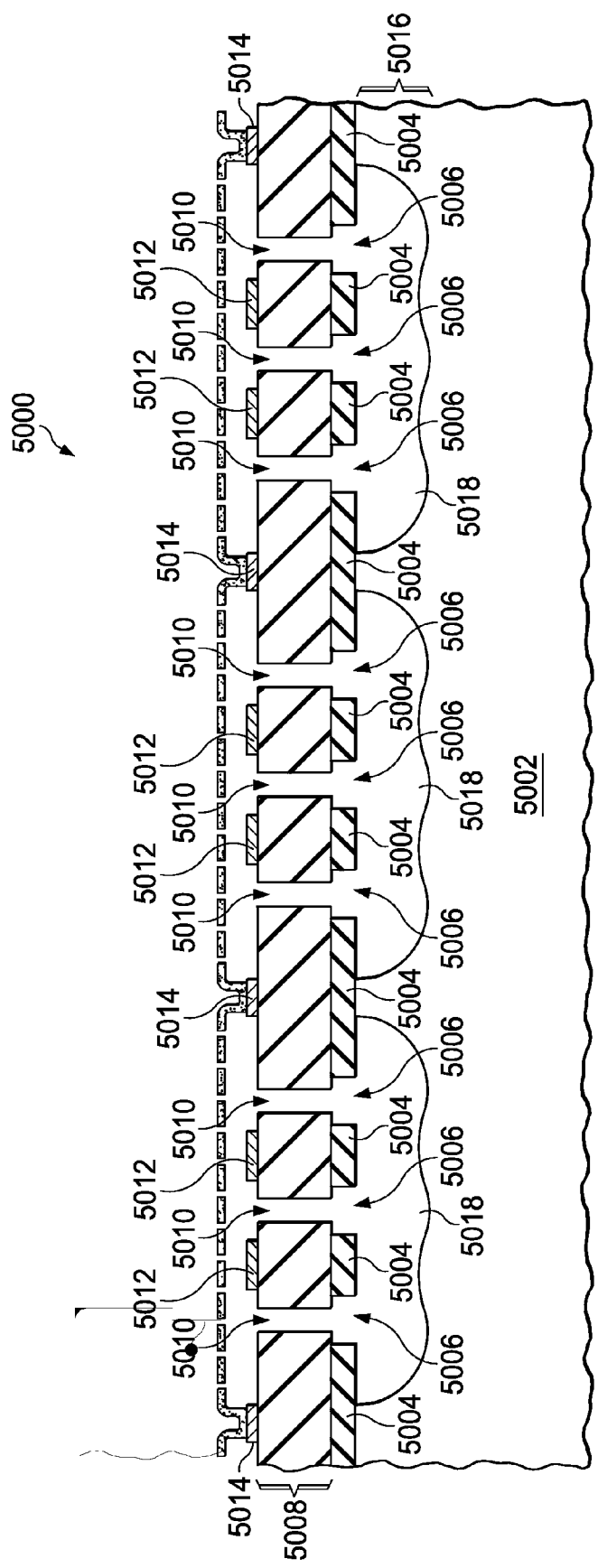
FIG. 5 is a cross-sectional view of an integrated circuit containing a capacitive microphone with a back side cavity including more than one cavity chamber.

FIG. 5 is a cross-section of an integrated circuit containing a capacitive microphone with a back side cavity including more than one cavity chamber. The integrated circuit 5000 is built in and on a substrate 5002 as described in reference to FIG. 1A. In one embodiment, field oxide 5004 may be formed at a top surface of the substrate 5002 with access holes 5006 as described in reference to FIG. 1A. In an alternate embodiment, a dielectric support layer may be formed on the top surface of the substrate 5002 as described in reference to FIG. 3A, and access holes 5006 formed in the dielectric support layer as described in reference to FIG. 3B. In some embodiments, an interconnect region 5008 may be formed above the substrate 5002 and the field oxide 5004 or the dielectric support layer, according to the specific embodiment, as described in reference to FIG. 2A and FIG. 4A. In such embodiments, access vias 5010 are formed through the interconnect region 5008, as described in reference to FIG. 2C and FIG. 4B. A fixed plate 5012 of the capacitive microphone is formed above the substrate, as described in reference to FIG. 1B, FIG. 2B, FIG. 3A or FIG. 4A, according to the specific embodiment. A permeable membrane 5014 of the capacitive microphone is formed above the fixed plate 5012, separated from the fixed plate 5012 by a space as described in reference to FIG. 1D through FIG. 1F, FIG. 2D through FIG. 2F, FIG. 3C through FIG. 3E, or FIG. 4C through FIG. 4E, according to the specific embodiment.

A back side cavity 5016 with multiple cavity chambers 5018 is formed in the substrate 5002 below the fixed plate, as described in reference to FIG. 1G through FIG. 1I, FIG. 2G and FIG. 2H, FIG. 3G and FIG. 3H, or FIG. 4F and FIG. 4G, according to the specific embodiment. In some embodiments, the membrane 5014 may be supported above substrate regions between the cavity chambers 5018 as depicted in FIG. 5. In some realizations of embodiments containing multiple cavity chambers, the back side cavity 5016 may extend laterally beyond the membrane 5014.

In some embodiments, a sum of a volume of the back side cavity 5016 and a volume of the access vias 5010 if present is more than 100 times as large as a volume of the space between the fixed plate 5012 and the membrane 5014. In further embodiments, the sum of the volume of the back side cavity 5016 and the volume of the access vias 5010 if present is more than 1000 times as large as the volume of the space between the fixed plate 5012 and the membrane 5014.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit including a capacitive microphone, comprising:
   a substrate;
   a dielectric layer formed over the substrate with access holes through the dielectric layer, the dielectric layer including field oxide formed as shallow trench isolation (STI) regions;
   a fixed plate formed over the dielectric layer; and
   a permeable membrane formed over the fixed plate with spacing between the membrane and the fixed plate defining an upper cavity;
   wherein a back side cavity formed below the dielectric layer in the substrate connects to the upper cavity through the access holes.

2. The circuit of claim 1, wherein the dielectric layer includes silicon nitride.

3. The circuit of claim 1, wherein the back cavity has a volume more than 100 times larger than the upper cavity.

4. An integrated circuit including a capacitive microphone, comprising:
   a substrate;
   a dielectric layer formed over the substrate with access holes through the dielectric layer;
   an interconnect region formed over the dielectric layer;
   a fixed plate formed over the dielectric layer, with the fixed plate located over the interconnect region; and
   a permeable membrane formed over the fixed plate with spacing between the membrane and the fixed plate defining an upper cavity;
   wherein a back side cavity formed below the dielectric layer in the substrate connects to the upper cavity through the access holes.

5. An integrated circuit including a capacitive microphone, comprising:
   a substrate;
   a dielectric layer formed over the substrate with access holes through the dielectric layer;
   a fixed plate formed over the dielectric layer; and
   a permeable membrane formed over the fixed plate with spacing between the membrane and the fixed plate defining an upper cavity;
   wherein a back side cavity formed below the dielectric layer in the substrate connects to the upper cavity through the access holes; and wherein the back side cavity is formed with more than one cavity chamber.

6. An integrated circuit including a capacitive microphone, comprising:
   a dielectric layer comprising dielectric filled trench regions laterally spaced at intervals in a microphone region of a surface of a substrate;
   a first layer of conductive material formed over the filled trench regions with at least portions of the intervals between the trench regions not covered by conductive material, the conductive material formed over the trench regions defining a first capacitor plate and terminal regions peripherally of the first capacitor plate;
   a second layer of conductive material formed with a spacing over the first capacitor plate and extending down to the terminal regions peripherally of the first capacitor plate, the second layer of conductive material defining a second capacitor plate spaced above the first capacitor plate between the terminal regions and formed with holes therethrough;
   wherein the substrate includes a cavity to a depth including under the filled trench regions open at the intervals to connect through the holes to spacing between the first and second capacitor plates.

7. The circuit of claim 6, wherein the first layer of conductive material comprises metal silicide formed over the filled trench regions.

* * * * *